(12) United States Patent
Ho et al.

(10) Patent No.: US 7,800,094 B2
(45) Date of Patent: Sep. 21, 2010

(54) RESISTANCE MEMORY WITH TUNGSTEN COMPOUND AND MANUFACTURING

(75) Inventors: ChiaHua Ho, Kaoshing (TW); Erh Kun Lai, Longjing Shiang (TW)

(73) Assignee: Macronix International Co., Ltd., Hsinchu (TW)

( * ) Notice: Subject to any disclaimer, the term of this patent is extended or adjusted under 35 U.S.C. 154(b) by 47 days.

(21) Appl. No.: 11/955,137

(22) Filed: Dec. 12, 2007

(65) Prior Publication Data

US 2008/0304312 A1 Dec. 11, 2008

Related U.S. Application Data

(60) Provisional application No. 60/943,300, filed on Jun. 11, 2007.

(51) Int. Cl.
*H01L 47/00* (2006.01)
(52) U.S. Cl. .................. 257/4; 257/5; 257/E45.003; 257/536
(58) Field of Classification Search .................. 257/4, 257/5, 243, E45.002, E45.003
See application file for complete search history.

(56) References Cited

U.S. PATENT DOCUMENTS

2004/0026729 A9 * 2/2004 Krieger et al. ............... 257/306

OTHER PUBLICATIONS

Ho, Chiahua, et al., "A 2-bit/cell, Maskless, Self-Aligned Resistance Memory with High Thermal Stability," Int'l Symp. on VLSI-TSA 2007, Apr. 23-25, 2007, 2 pages.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

Seo, S., et al., "Conductivity switching characteristics and reset currents in NiO Films," Appl. Phys. Lett. 86, 093509 (2005), 3 pages.

Baek, I.G., et al., "Multi-layer Cross-point Binary Oxide Resistive Memory (OxRRAM) for Post-NAND Storage Application," IEEE (2005), 4 pages.

Baek, I.G., et al., "Highly Scalable Non-volatile Resistive Memory using Simple Binary Oxide Driven by Asymmetric Unipolar Voltage Pulses," IEEE IEDM, 04-587, (2004) 4 pages.

Seo, S., et al., "Reproducible resistance switching in polycrystalline NiO films," Appl. Phys. Lett., vol. 85, No. 23, Dec. 6, 2004, 3 pages.

(Continued)

*Primary Examiner*—Fernando L Toledo
*Assistant Examiner*—Mamadou Diallo
(74) *Attorney, Agent, or Firm*—Haynes Beffel & Wolfeld LLP

(57) ABSTRACT

Memory devices based on tungsten-oxide memory regions are described, along with methods for manufacturing and methods for programming such devices. The tungsten-oxide memory region can be formed by oxidation of tungsten material using a non-critical mask, or even no mask at all in some embodiments. A memory device described herein includes a bottom electrode and a memory element on the bottom electrode. The memory element comprises at least one tungsten-oxygen compound and is programmable to at least two resistance states. A top electrode comprising a barrier material is on the memory element, the barrier material preventing movement of metal-ions from the top electrode into the memory element.

17 Claims, 36 Drawing Sheets

OTHER PUBLICATIONS

Chen, An, et al., "Non-Volatile Resistive Switching for Advanced Memory Applications," IEEE (2005) 4 pages.

Bringans, R.D., et al., "Defect states in $WO_3$ studied with photoelectron spectroscopy," Phys. Rev. B., v. 24, No. 6, Sep. 15, 1981, 9 pages.

Kim, D.C., et al., "Improvement of resistive memory switching in NiO using $IrO_2$," Appl. Phys. Lett., 88, 232106 (2006) 3 pages.

Ho, Chiahua, et al., "A Highly Reliable Self-Aligned Graded Oxide $WO_x$ Resistance Memory: Conduction Mechanisms and Reliability," 2007 IEEE Symp. on VLSI Tech., Jun. 12-14, 2007, 228-229.

Kozicki, Michael N., et al., "A Low-Power Nonvolatile Switching Element Based on Copper-Tungsten Oxide Solid Electrolyte,", 2005 Silicon Nanoelectronics Workshop, Kyoto Japan, Jun. 12-13, 2005, pp. 34 and 35.

* cited by examiner

RESISTANCE MEMORY WITH TUNGSTEN COMPOUND AND MANUFACTURING

CROSS-REFERENCE TO RELATED APPLICATIONS

This application claims the benefit of U.S. provisional patent application No. 60/943,300 entitled "Methods of Manufacturing Embedded Resistance Memory with Tungsten Compound" filed on 11 Jun. 2007, which is incorporated by reference herein.

BACKGROUND OF THE INVENTION

1. Field of the Invention

The present invention relates to memory devices and methods for manufacturing high density memory devices, and more particularly to memory devices having a data storage material based on tungsten-oxygen compounds.

2. Description of Related Art

Nonvolatile memory devices include magnetic random access memory MRAM, ferroelectric random access memory FRAM and phase-change random access memory PCRAM and other resistive random access memory RRAM. RRAM has attracted much attention because of its simple structure and small cell size.

Metal-oxide based RRAM can be caused to change resistance between two or more stable ranges by application of electrical pulses at levels suitable for implementation in integrated circuits, and the resistance can be read and written with random access to indicate stored data.

NiO, $TiO_2$, $HfO_2$, and $ZrO_2$ based RRAM have been investigated for use as a memory material in memory cells. See, Baek, et al., "Highly Scalable Non-Volatile Resistive Memory using Simple Binary Oxide Driven by Asymmetric Unipolar Voltage Pulses", IEDM Technical Digest pp. 23.6.1-23.6.4, IEEE International Electron Devices Meeting 2004. These memory cells are formed by a non-self-aligned process in a M-I-M structure, where M is a noble metal acting as an electrode and I is one of NiO, $TiO_2$, $HfO_2$, and $ZrO_2$. This MIM structure requires several additional masks and patterning to form the noble metal electrodes and the memory material, and results in a relatively large memory cell size.

$Cu_xO$ based RRAM has also been investigated for use as a memory material in memory cells. See, Chen et al., "Non-Volatile Resistive Switching for Advanced Memory Applications", IEDM Technical Digest pp. 746-749, IEEE International Electron Devices Meeting 2005. The $Cu_xO$ material is formed by thermal oxidation of a copper via which acts as the bottom electrode for the memory cell, while the top electrode consists of a bi-layer Ti/TiN film that is deposited and etched. This structure requires several additional masks to form the top and bottom electrodes, and results in a relatively large memory cell size. Chen et al. disclose that having a copper bottom electrode complicates erasing of the memory cell since the applied field during erasing may push copper ions into the $Cu_xO$. Additionally, $Cu_xO$ has a relatively small resistance window of 10×.

Cu—$WO_3$ based RRAM has also been investigated for use as a memory material in memory cells. See, Kozicki et al., "A Low-Power Nonvolatile Switching Element Based on Copper-Tungsten Oxide Solid Electrolyte", IEEE Transactions on Nanotechnology pp. 535-544, Vol. 5, No. 5, September 2006. Switching elements fabricated using tungsten metal, a solid electrolyte based on tungsten-oxide and photodiffused copper, and a copper top electrode are disclosed. The switching element is formed by tungsten-oxide grown or deposited on tungsten material, a layer of Cu formed on the tungsten-oxide and the Cu photodiffused into the tungsten-oxide to form the solid electrolyte, and a Cu layer is formed and patterned over the solid electrolyte to act as a top electrode. The switching element changes resistance by applying a bias voltage to cause electrodeposition of Cu ions from the top electrode into the solid electrolyte, and states that "a lack of Cu in the top electrode results in no measurable switching activity" (see page 539, column 1). This structure thus needs a Cu top electrode, involves several process steps to form the solid electrolyte, and necessitates bias voltages of opposite polarities to cause the injection of Cu ions to program and erase the solid electrolyte.

Thus, it is desirable to provide a memory cell structure having a self-aligned metal-oxide memory material with a large resistance widow and having a small cell size for use in high density RRAM devices. Additionally it is desirable for methods for manufacturing the high density RRAM devices which require a minimal number of process steps, are compatible with existing manufacturing technologies, and compatible with manufacturing of peripheral circuits on the same integrated circuit.

SUMMARY OF THE INVENTION

Memory devices based on tungsten-oxide memory regions are described, along with methods for manufacturing and methods for programming such devices.

A memory device as described herein includes a bottom electrode and a memory element on the bottom electrode. The memory element comprises at least one tungsten-oxygen compound and is programmable to at least two resistance states. A top electrode comprising a barrier material is on the memory element, the barrier material preventing movement of metal-ions from the top electrode into the memory element.

A method for manufacturing a memory device as described herein includes providing a subassembly comprising a memory cell region and a periphery region. The memory cell region comprises an access device and a first tungsten member coupled to the access device. The periphery region comprises a logic device and a second tungsten member coupled to the logic device, the first and second tungsten members extending to a top surface of the subassembly. A mask is formed on the top surface of the subassembly, and a portion of the first tungsten member is oxidized to form a memory element, the memory element comprising at least one tungsten-oxygen compound and being programmable to at least two resistance states. A top electrode is formed comprising a barrier material on the memory element, the barrier material preventing movement of metal-ions from the top electrode into the memory element.

A method for programming a memory cell as described herein includes selecting a memory cell comprising a memory element including at least one tungsten-oxygen compound and programmable to at least two resistance states. The method includes determining a data value for the memory cell, and applying a sequence of pulses to store the data value, the sequence of pulses adapted to set the resistance state of the memory element to a resistance corresponding to the data value.

A memory cell described herein includes a self-aligned tungsten-oxide based memory region that can be formed by oxidation of tungsten material. Tungsten material is commonly used in back-end-of-line BEOL processes, allowing the memory region to be formed using a minimal number of process steps. Due to the self-alignment of the memory region, the formation of the memory region can be achieved using a non-critical mask, and in some embodiments no additional mask will be needed. Furthermore, the memory region formation is compatible with the manufacturing of peripheral circuits on the same integrated circuit.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which:

FIG. 2 illustrates X-Ray Photelectron Spectroscopy data of O-ions and W-ions of the plug structure at various depths from the surface.

FIG. 3 illustrates a deconvolution of the W-ion XPS data of FIG. 2.

FIG. 4 illustrates two different kinds of current-voltage I-V behaviors for the memory cell, a linear (On state) and a non-linear (Off state) with an On/Off current ratio being greater than 100.

FIG. 5 illustrates a cycling endurance test of the resistance of the memory cell in the On state and the Off state versus cycle time, showing greater than 1 k cycling endurance.

FIG. 6 illustrates a 150° C. baking test for greater than 2000 hours of the memory cell in the On state and in the Off state.

FIG. 7 illustrates a 250° C. baking test for greater than 2000 hours of the memory cell in the On state and in the Off state.

FIG. 8 illustrates the relative change in resistance of the memory cell in the On state versus stress time for various read voltages applied to the memory cell.

FIG. 9 illustrates the Off state to On state resistance ratio of the memory cell as a function of read voltage as well as read cycle number.

FIG. 10 illustrates the temperature effect on the Off state current density J of the memory cell at a read voltage near zero volts.

FIG. 11 illustrates the temperature dependence of the On state resistance of the memory cell.

FIG. 12 illustrates the temperature effect of the resistivity and conductivity of the memory cell in the Off state and On state.

FIG. 13 illustrates the lower oxygen content in the lower regions of the memory region.

FIG. 14 illustrates the effect the number of program shots applied to the memory cell have on the resistance state of the memory region.

FIG. 15 illustrates that both $N_{c1}$ and $N_{c2}$ strongly depend on the bias arrangement and pulse duration of the program shots.

FIG. 16 illustrates the I-V curves for the respective resistance states "11", "10", "01", and "00" of FIG. 14.

FIG. 17 illustrates the temperature effect on the current density in the "00" state with an applied voltage near zero volts.

FIG. 18 illustrates the four resistance states versus time at room temperature.

FIG. 19 illustrates the four resistance states versus time at 350° C.

DETAILED DESCRIPTION

Figure 1A:
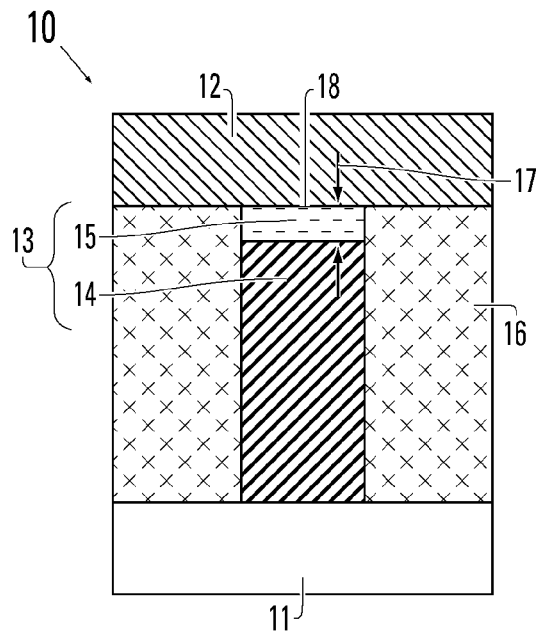
FIG. 1A illustrates a cross-sectional view of a memory cell in accordance with an embodiment, the memory cell having a plug structure contacting a bottom electrode and extending through a dielectric layer to contact a top electrode.

A description of structural embodiments and methods of the present invention is provided with reference to FIGS. 1-43. It is to be understood that there is no intention to limit the invention to the specifically disclosed embodiments but that the invention may be practiced using other features, elements, methods and embodiments. Like elements in various embodiments are commonly referred to with like reference numerals.

FIG. 1A illustrates a cross-sectional view of a memory cell 10 in accordance with an embodiment, the memory cell 10 having a memory element 13 contacting a bottom electrode 11 and extending through a dielectric layer 16 to contact a top electrode 12. The memory element 13 includes a metal portion 14 comprising tungsten in the illustrated embodiment, and a memory portion 15 self-aligned to the tungsten portion 14, the memory portion 15 having have a thickness 17 and a top surface 18 in contact with the top electrode 12. The bottom and top electrodes 11, 12 are each coupled to additional elements (not shown) such as access devices and bit lines.

The memory portion 15 comprises one or more tungsten-oxygen compounds $WO_x$, for example one or more of $WO_3$, $W_2O_5$, $WO_2$. The thickness 17 of the memory portion 15 may be, for example, less than or equal to about 50 nm, in one embodiment the thickness 17 being about 12 nm.

The top electrode 12 (which in some embodiments comprises a portion of a bit line) comprises a barrier material on the memory element 13, the barrier material sufficient to prevent movement of metal-ions from the top electrode 12 into the memory element 13. The top electrode 12 may comprise more than one layer in some embodiments. For example the top electrode 12 may comprise a conductive layer on the barrier layer, the conductive layer for example comprising one or more elements selected from the group consisting of Ti, W, Mo, Al, Ta, Cu, Pt, Ir, La, Ni, N, O, and Ru and combinations thereof. In one embodiment the top electrode 12 comprises a multi-layer structure of a first layer of TiN on the memory element 13, an AlCu layer on the first layer of TiN, and a second layer of TiN on the AlCu layer.

As used herein, the barrier material prevents movement of metal-ions by reducing or eliminating the movement of metal-ions. Examples of barrier materials include TiN, TiSiN, WN, Ta, TaN, TaSiN, WSiN. The barrier material may have a thickness of between about 1 nm and 70 nm for example.

The bottom electrode 11 is an electrically conductive element. For example, the bottom electrode 11 may be a drain terminal of an access transistor or a terminal of a diode. In one embodiment the bottom electrode 11 comprises a multi-layer structure of a first layer of TiN on the memory element 13, an AlCu layer on the first layer of TiN, and a second layer of TiN on the AlCu layer. As further examples, the bottom electrode may comprise one or more elements selected from the group consisting of Ti, W, Mo, Al, Ta, Cu, Pt, Ir, La, Ni, N, O, and Ru and combinations thereof.

In operation, voltages applied to the top and bottom electrodes 12, 11 will cause current to flow between the top and bottom electrodes 12, 11 via the memory element 13 and can induce a programmable change in electrical resistance of the memory portion 15, the electrical resistance indicating a data value stored in the memory cell 10. In some embodiments the memory region 15 of the memory cell 10 can store two or more bits of data.

Figure 1B:
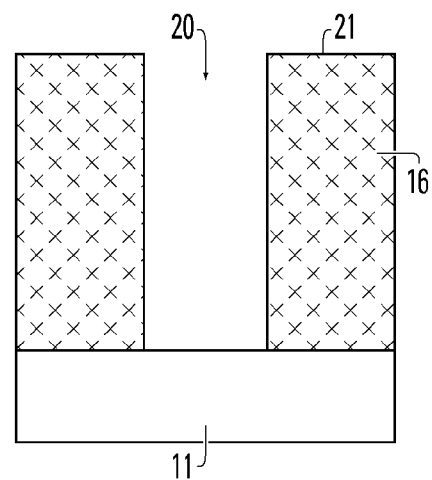
FIGS. 1B-1D illustrate a method for manufacturing the memory cell of FIG. 1A in accordance with an embodiment.
Figure 1C:
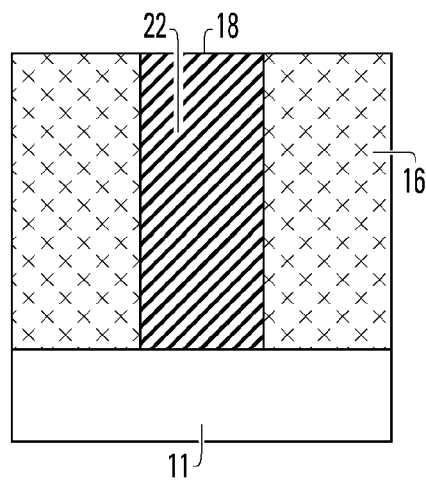
Figure 1D:
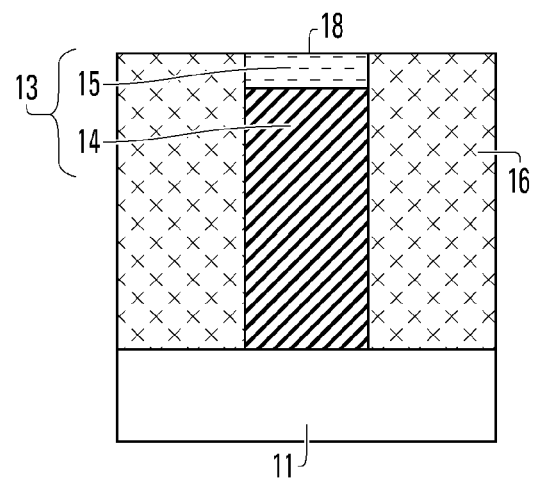

The memory region 15 can be formed by the steps illustrated in FIGS. 1B-1D. Following standard front-end-of-the-line FEOL processes as known in the art, a via 20 is formed in the dielectric 16 to expose the bottom electrode 11, the dielectric 16 having a top surface 21 as shown in FIG. 1B.

Next, a tungsten plug 22 having a top surface 18 is formed in the via 20, resulting in the structure illustrated in FIG. 1C. The tungsten plug 22 can be formed by depositing tungsten material in the via 20, for example by using Chemical Vapor Deposition CVD, followed by a planarizing step such as Chemical Mechanical Polishing CMP.

Next, oxidation of a portion of the plug 22 forms the memory portion 15 self-aligned to the tungsten portion 14, resulting in the structure illustrated in FIG. 1D having memory element 13. The oxidation can comprise a plasma oxidation step and an optional thermal oxidation step. Plasma oxidation used to form memory portion 15 can result in a graded $W_xO_y$ having concentrations of tungsten-oxygen compounds that have a distribution that varies with distance from the top surface 18.

Since the oxidation of the plug 22 results in the formation of the memory portion 15, the formation can be achieved using a non-critical mask to define which plugs 22 in an array should contain memory portions 15 and which plugs should remain as interconnects between layers in the array. As can be appreciated by those skilled in the art, depending on the array structure in some embodiments no additional mask will be needed.

Next, a top electrode 12 comprising a barrier material is formed on the structure illustrated in FIG. 1D, resulting in the memory cell 10 illustrated in FIG. 1A, the top electrode 12 in some embodiments comprising a portion of a bit line. In one embodiment the top electrode 12 comprises a multi-layer stack of TiN, AlCu, and TiN on the memory element 13.

FIGS. 2-12 illustrate data for an embodiment of the memory cell 10 having a memory portion 15 storing two switchable data values (1 bit), a high-resistance Off state and a low-resistance On state. In the tested embodiment for which data is illustrated in FIGS. 2-12 the memory portion 15 was formed by plasma oxidation of tungsten material of the memory element 13 and had a thickness 17 of about 120 Angstroms.

Figure 2:
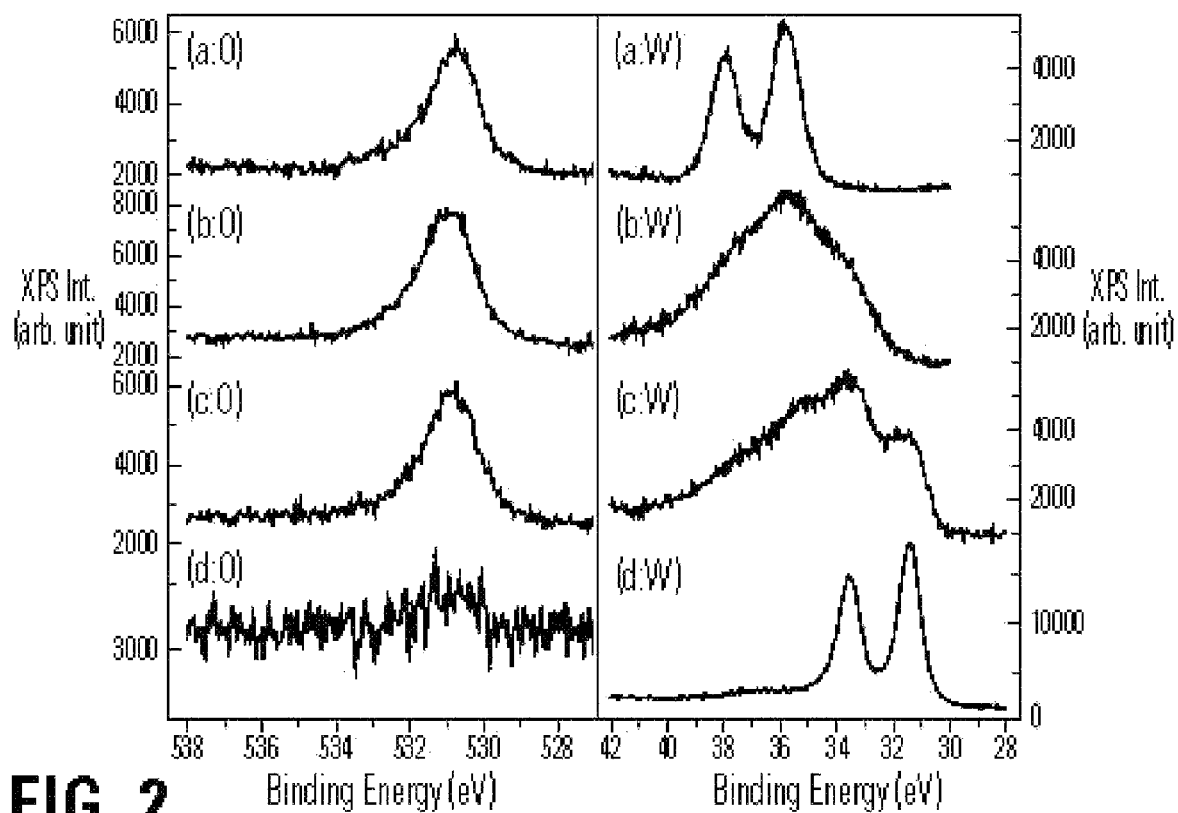
FIGS. 2-12 illustrate data for an embodiment of the memory cell having a memory region storing two switchable data values, a high-resistance Off state and a low-resistance On state.

FIG. 2 illustrates X-Ray Photoelectron Spectroscopy XPS data of the memory element 13 showing measured oxygen O ions (left-hand side) and tungsten W ions (right-hand side) at depths from the surface 18 of 0 Angstroms (FIG. 2 a:O and a:W), 15 Angstroms (FIG. 2 b:O and b:W), 70 Angstroms (FIG. 2 c:O and c:W), and 140 Angstroms (FIG. 2 d:O and d:W).

Figure 3:
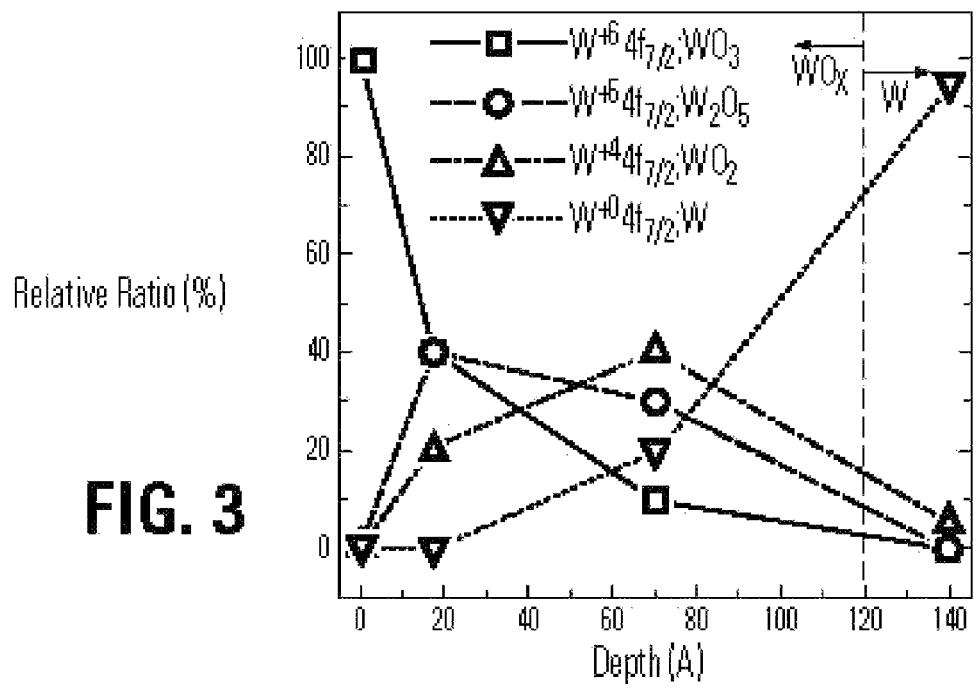

FIG. 3 illustrates a deconvolution of the W-ion XPS data of FIG. 2 and shows the vertical variation of W-ions in the memory element 13 with depth from the surface 18. As can be seen in FIG. 3, $WO_3$ dominates near the surface 18 while multiple compounds including $WO_3$, $W_2O_5$, $WO_2$, etc are in the deeper regions. The plasma oxidation used to form the memory portion 15 produces both monotonically decreasing ion valence values ($W^{+6}$, W+5, W+4, and $W^0$), as well as lower oxygen content in the deeper regions.

Figure 4:
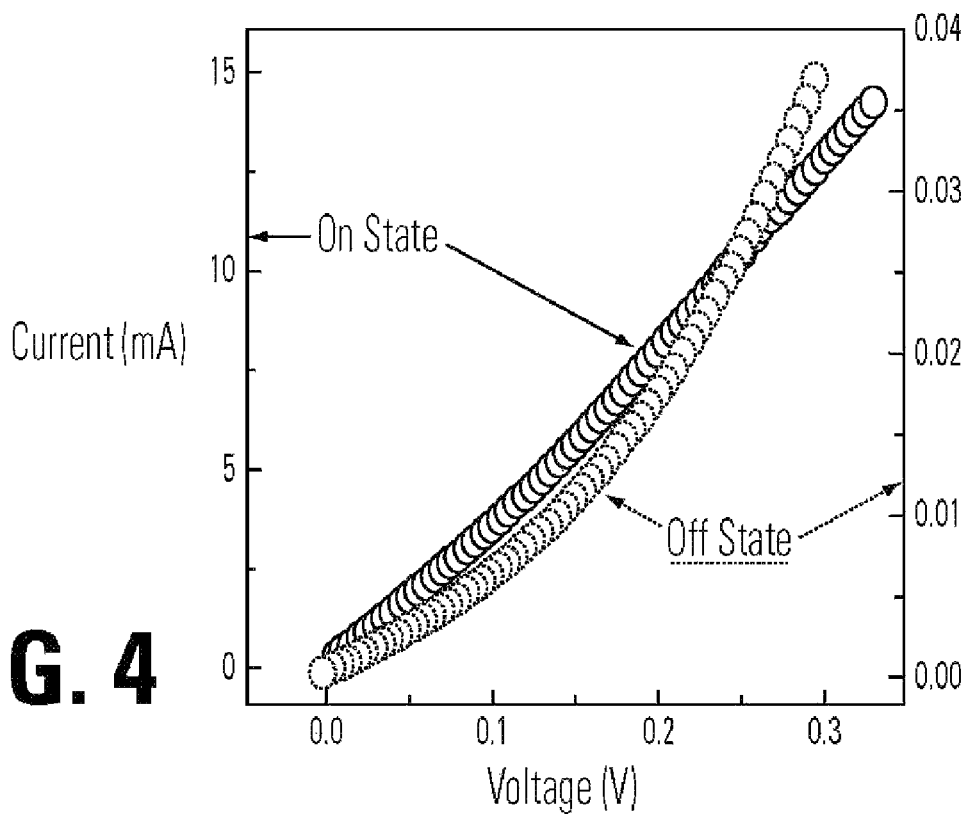

FIG. 4 shows two different kinds of current-voltage I-V behaviors for the memory cell 10, a linear (On state) and a non-linear (Off state) with the On/Off current ratio being greater than 100. A pulse with a voltage difference of approximately 4 to 5 V between the top and bottom electrodes 12, 11 and having a duration of between about 50 ns and 80 ns can be used to switch the memory cell between On and Off states. Shorter pulses with durations of less than about 10 ns using higher voltages can also be used to switch the state of the memory cell 10.

Figure 5:
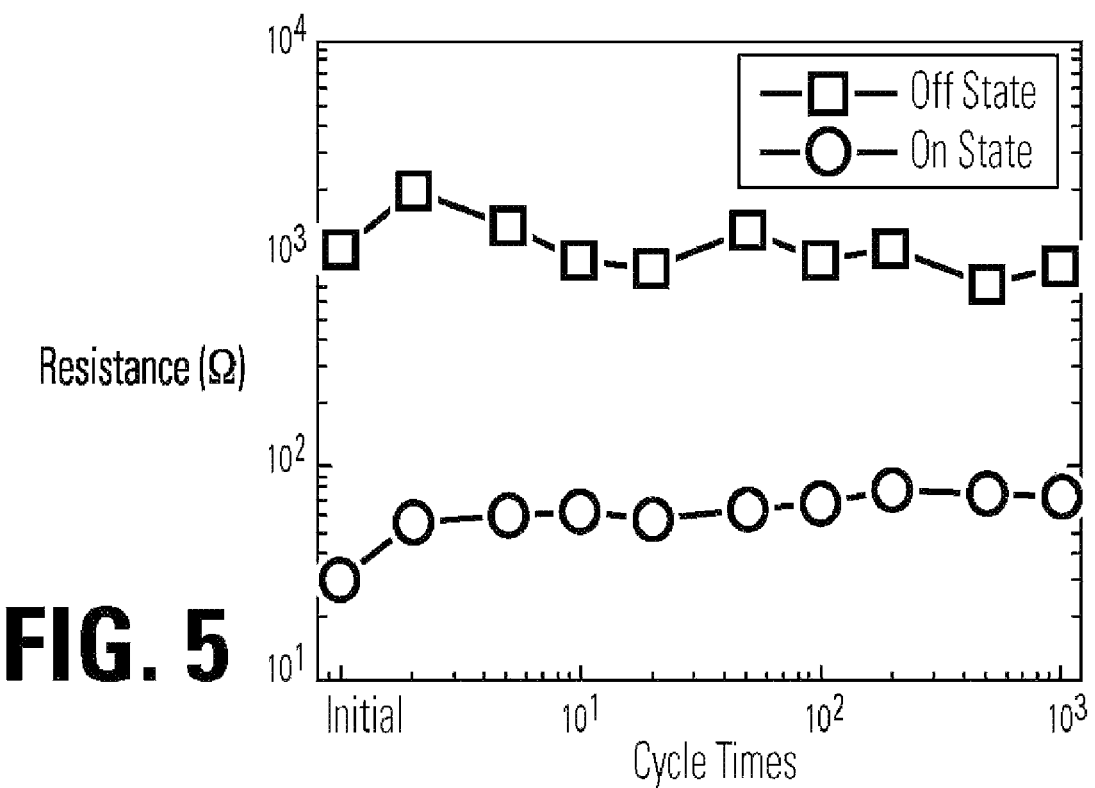

FIG. 5 shows a cycling endurance test of the resistance of the memory cell 10 in the On state and the Off state versus number of cycles, showing greater than 1 k cycling endurance.

Figure 6:
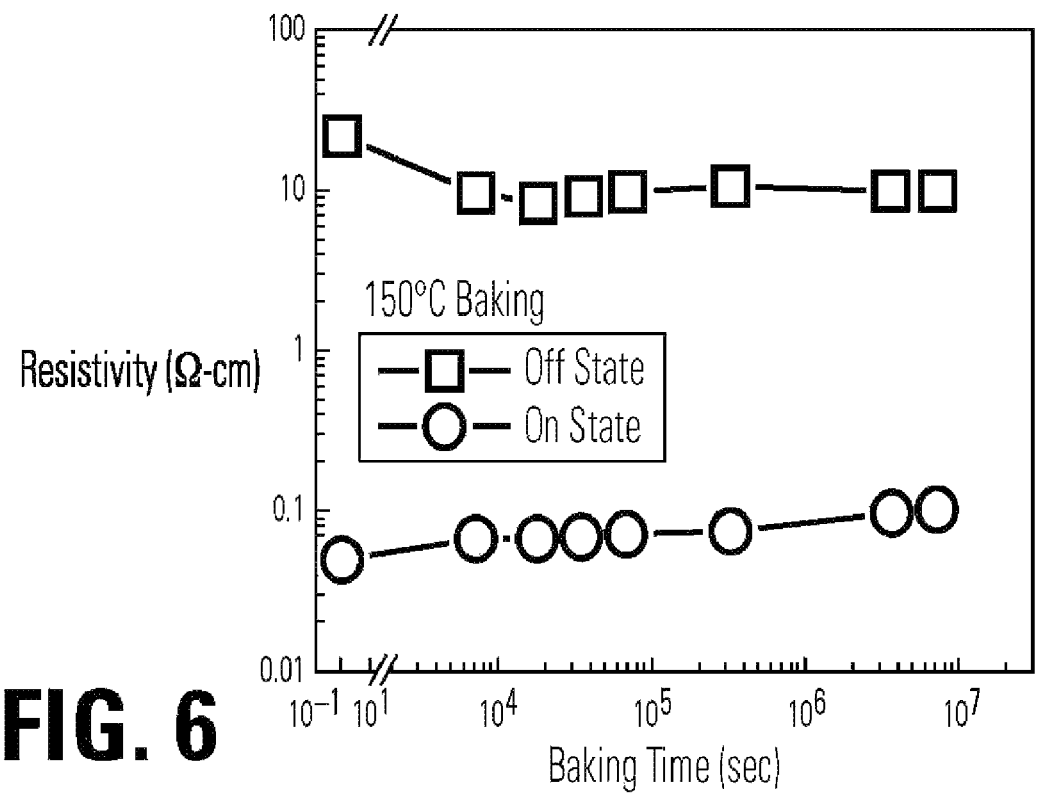
Figure 7:
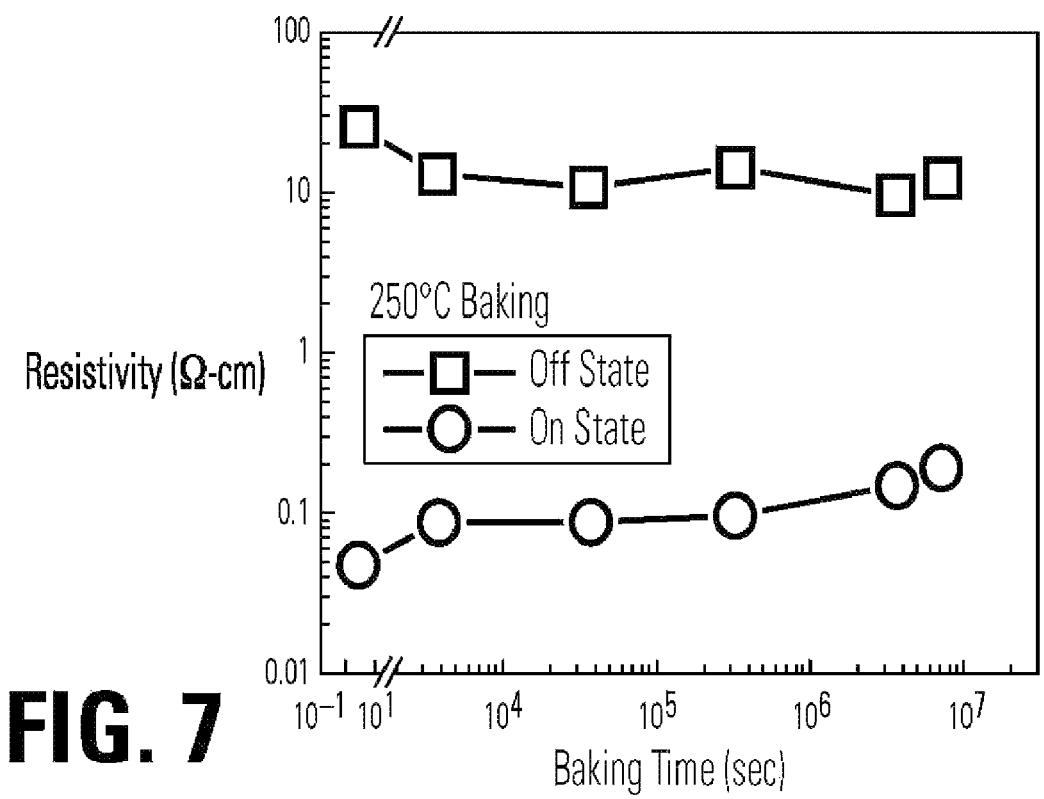

FIGS. 6 and 7 respectively show a 150° C. and a 250° C. baking test for greater than 2000 hours of the memory cell 10 in the On state and in the Off state, showing very high thermal stability for the memory cell 10. After the baking tests the memory cell 10 can still be re-programmed to either of the On state and the Off state.

Figure 8:
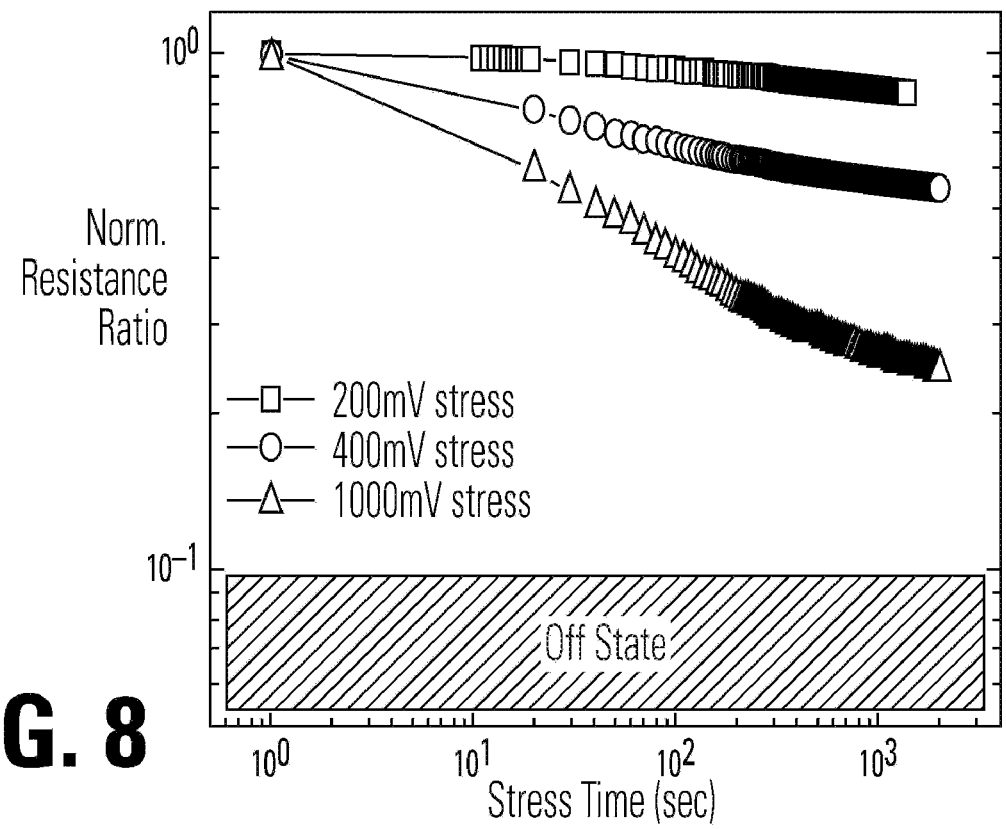
Figure 9:
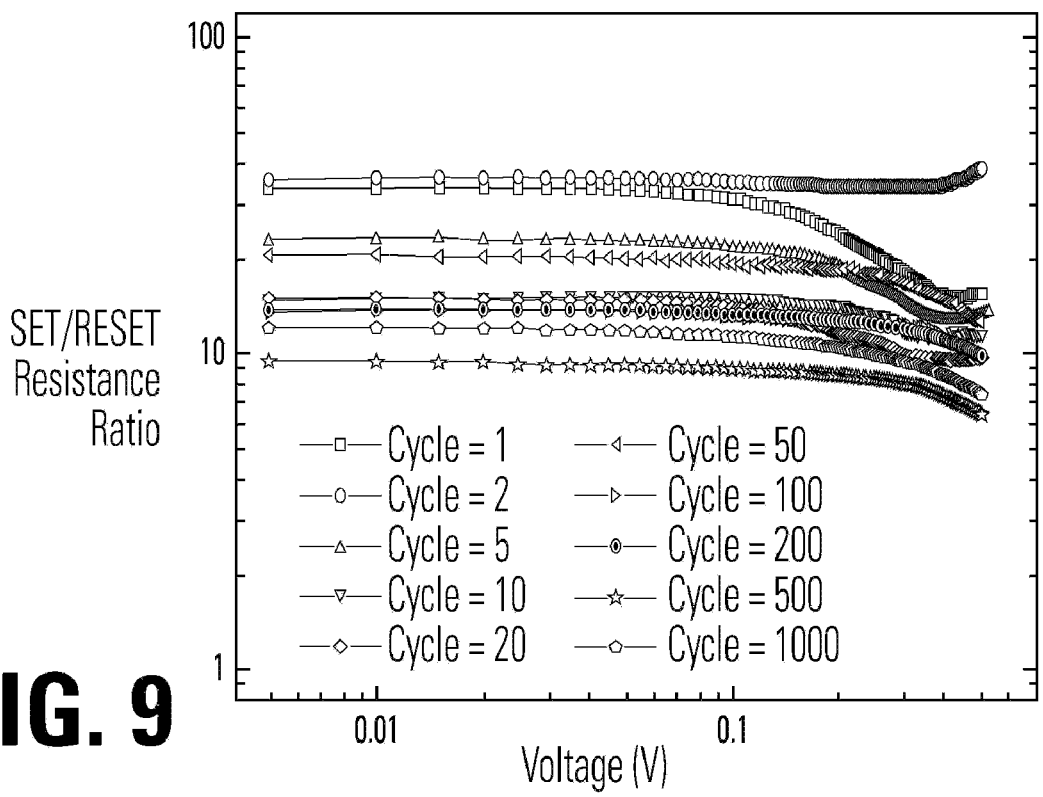

FIG. 8 shows the relative change in resistance of the memory cell 10 in the On state versus stress time for various stress read voltages applied to the memory cell 10. FIG. 9 shows the Off state to On state resistance ratio of the memory cell 10 as a function of read voltage as well as read cycle number. FIGS. 8 and 9 show that the memory cell 10 has good read disturb immunity. For example, stressing using a read voltage under 200 mV causes little disturb and the device read endurance is at least 1013 times at a read speed of several tens of nsec.

Figure 10:
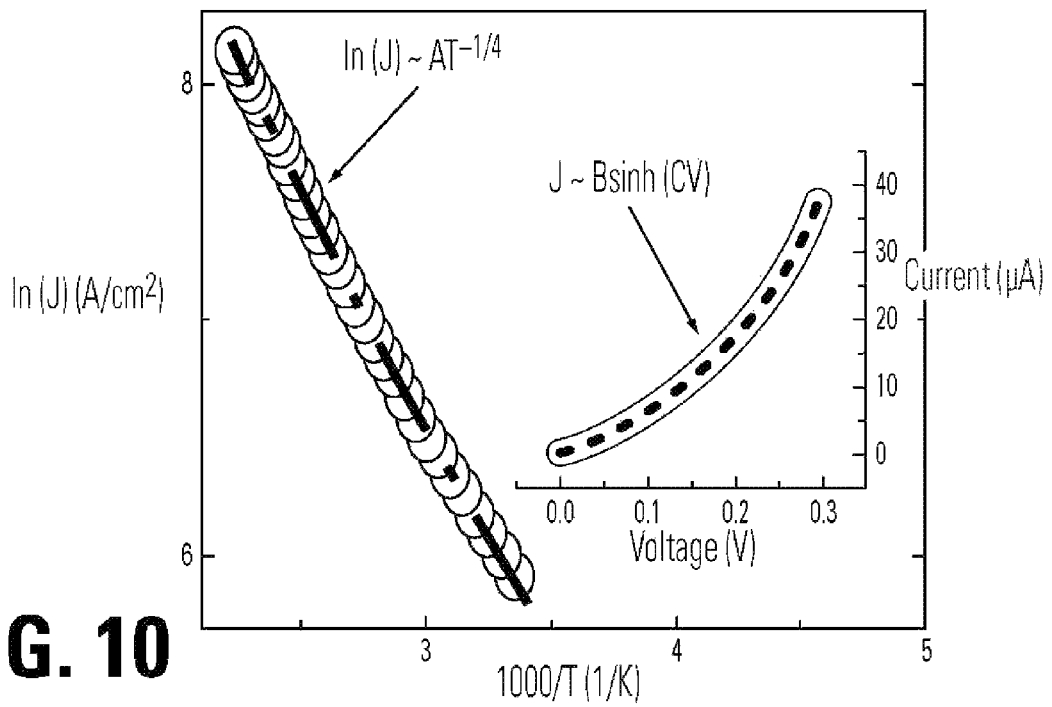

FIG. 10 shows the temperature effect on the Off state current density J of the memory cell at a read voltage near zero volts. The Off state current density J is well fitted by a dashed line having a $T^{-1/4}$ dependence, suggesting a variable-range hopping VRH conduction mechanism in the Off state in which the Fermi energy lies near the localized state. The VRH conduction mechanism is described by the relationship:

$$J \sim kT \cdot \exp(-CT^{-1/4}) \sin h(DV/kT) \qquad (1)$$

where C and D are constants, and k is the Boltzman constant. As can be seen in equation (1), when the voltage is close to zero the current density depends most strongly on the $\exp(T^{-1/4})$ component. The inset of FIG. 10 shows a dashed line hyperbolic-sine fitting of the I-V curve of the memory cell 10 in the Off state, further strengthening the suggestion of a VRH conduction mechanism. From the data in the inset of FIG. 10, it is estimated that the hopping distance is approximately 15 Angstroms for electrons to hop from one oxygen vacancy with $W^{+m}$ to another one with $W^{+n}$. This long hopping distance is most likely responsible for the high resistance of the Off state.

Figure 11:
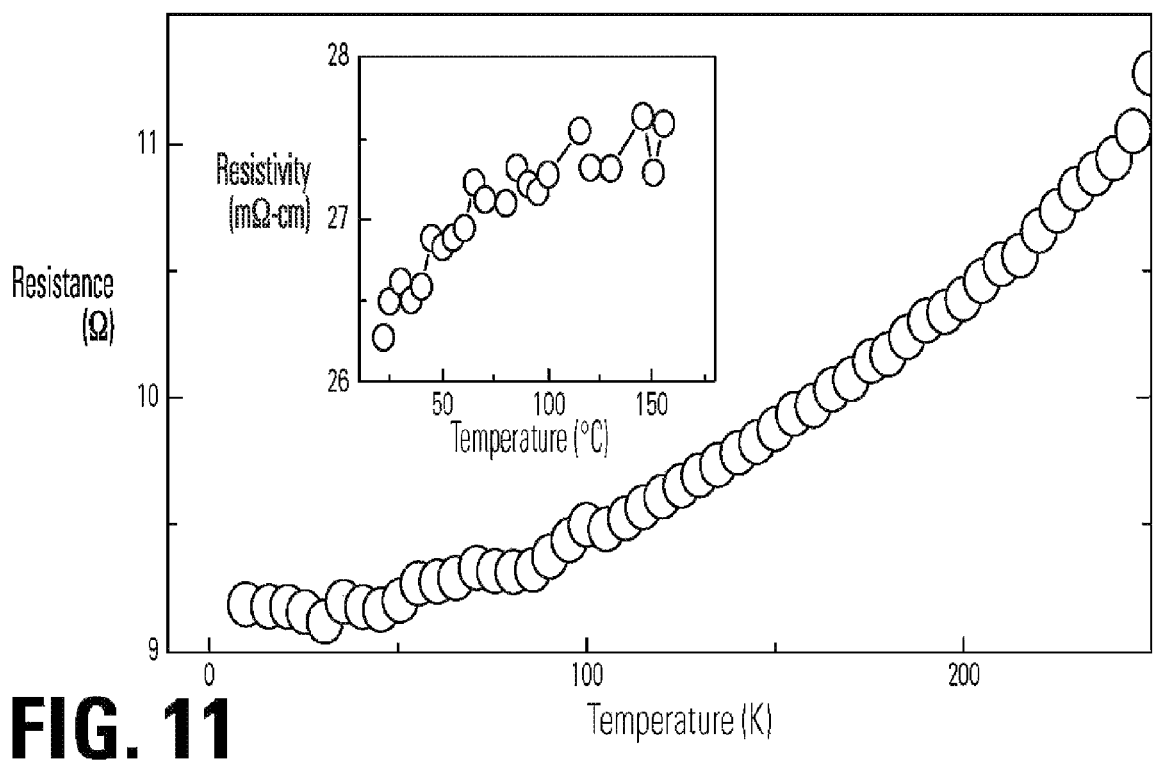
Figure 12:
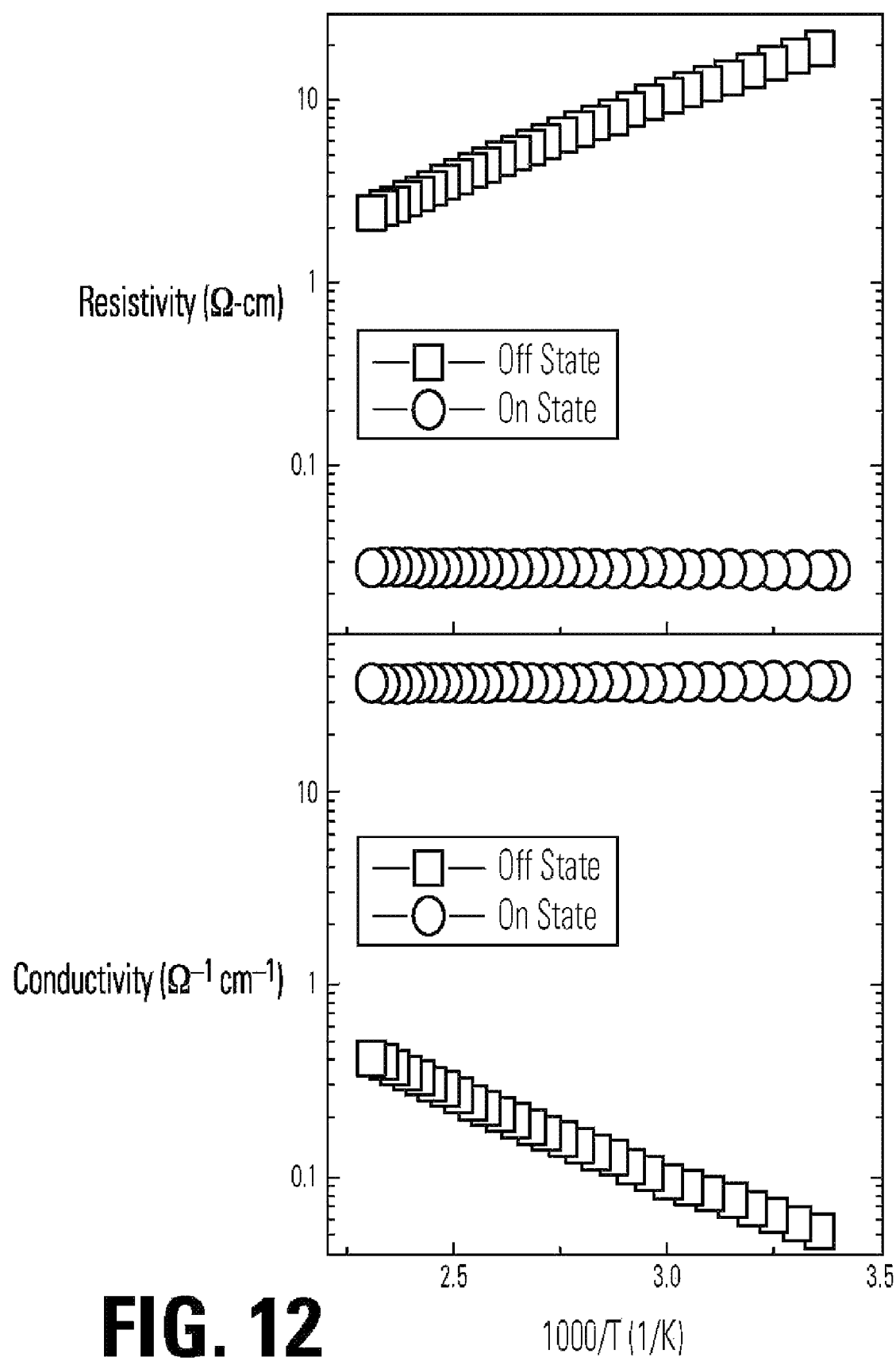

FIG. 11 shows the temperature dependence of the On state resistance of the memory cell 10. The finite residual resistance at low temperatures (approaching 0 K) suggests that metallic conduction dominates in the On state, the metallic conduction resulting in an I-V characteristic close to Ohmic (linear). With a conductivity of about 40 $\Omega^{-1}$ cm$^{-1}$ (inset of FIG. 11) this metallic state appears close to the minimum-metallic-conductivity (MMC), the weakest metallic state when there is no localized state near the Fermi level. The transition from VRH to MMC (Off state to On state) or vice versa by voltage pulses is most likely a form of the Anderson metal-insulator transition. This is further supported by the temperature effect on these two modes of conduction in the Off state and On state as illustrated in FIG. 12.

Both the VRH and MMC mechanisms are different from the electrical properties of pure $WO_3$, where a direct band gap behavior dominates and which does not appear to exhibit RRAM characteristics. This suggests that the switchable states arise from localized states near the Fermi level, induced by the defect (oxygen vacancy) state distribution in the memory portion 15—such as those introduced by plasma oxidation used to form the memory portion 15. Based on this model, it is conjectured that resistance switching of the memory cell 10 is the result of a changeable energy difference, $\Delta E$, between Fermi level and the edge of the localized state. If $\Delta E$ is greater than approximately zero, it is an On state. Otherwise, it is an Off state.

From FIG. 10 the hopping activation energy of the Off state can be obtained as approximately 0.4 eV. The energies of electrons induced by high temperature baking (150° C.=36 meV and 250° C.=45 meV) are much smaller than the hopping activation energy, thus few thermal electrons can overcome the barrier of the localized state and affect the electrical characteristics in the Off state. Because the On state is insensitive to temperature change, the retention model for the On state is unclear.

Figure 13:
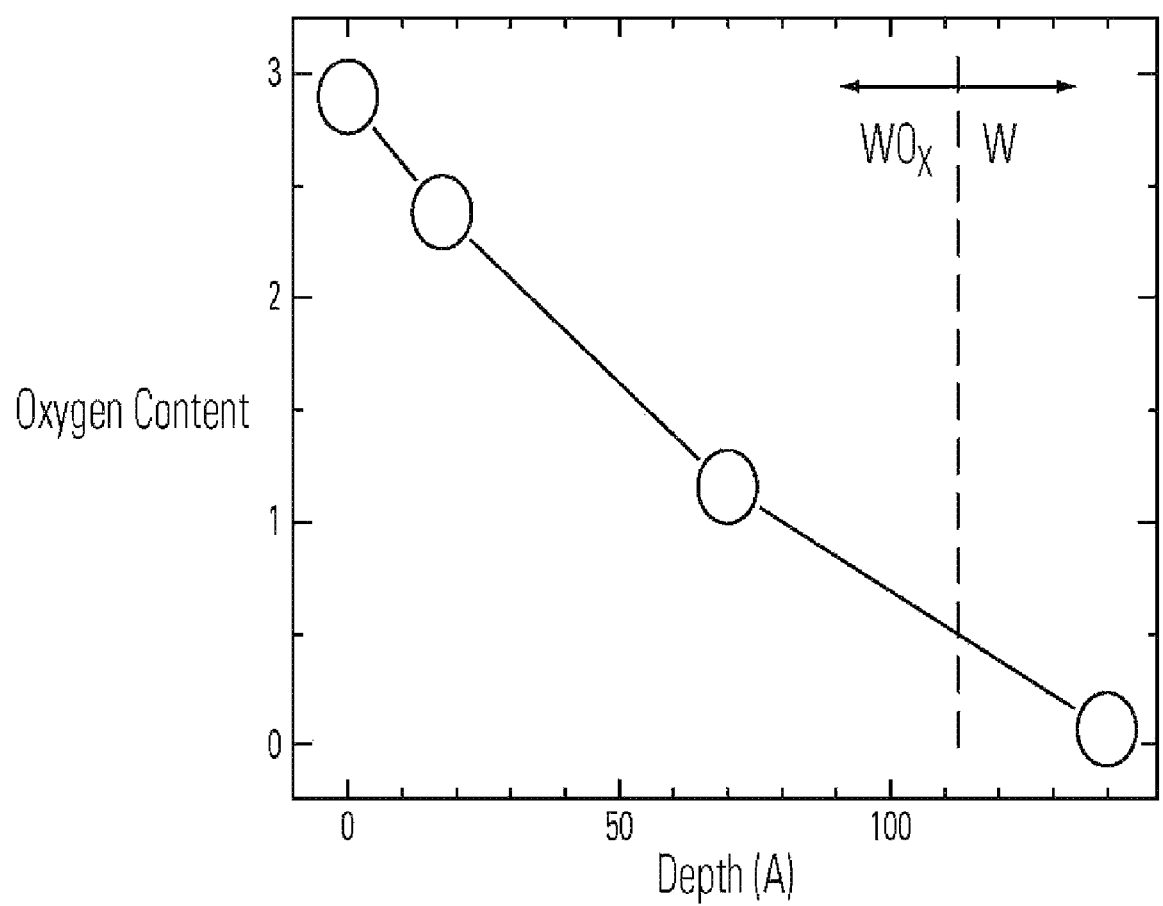
FIGS. 13-19 illustrate data for an embodiment of the memory region of the memory cell storing four switchable data values.

FIGS. 13-19 illustrate data for an embodiment of the memory portion 15 of the memory cell 10 storing four switchable data values (two bits). In the tested embodiment for which data is illustrated in FIGS. 13-19 the memory portion 15 was formed by plasma oxidation of tungsten material of the memory element 13 and had a thickness 17 of about 120 Angstroms. $WO_3$ dominates near the surface 18 while multiple compounds are in deeper regions, including $WO_3$, $W_2O_5$, $WO_2$, etc. The plasma oxidation used to form the memory region 15 produces both monotonically decreasing ion valence values ($W^{+6}$, $W^{+5}$, $W^{+4}$, and $W^0$), as well as lower oxygen content in deeper layers as is shown in FIG. 13.

Figure 14:
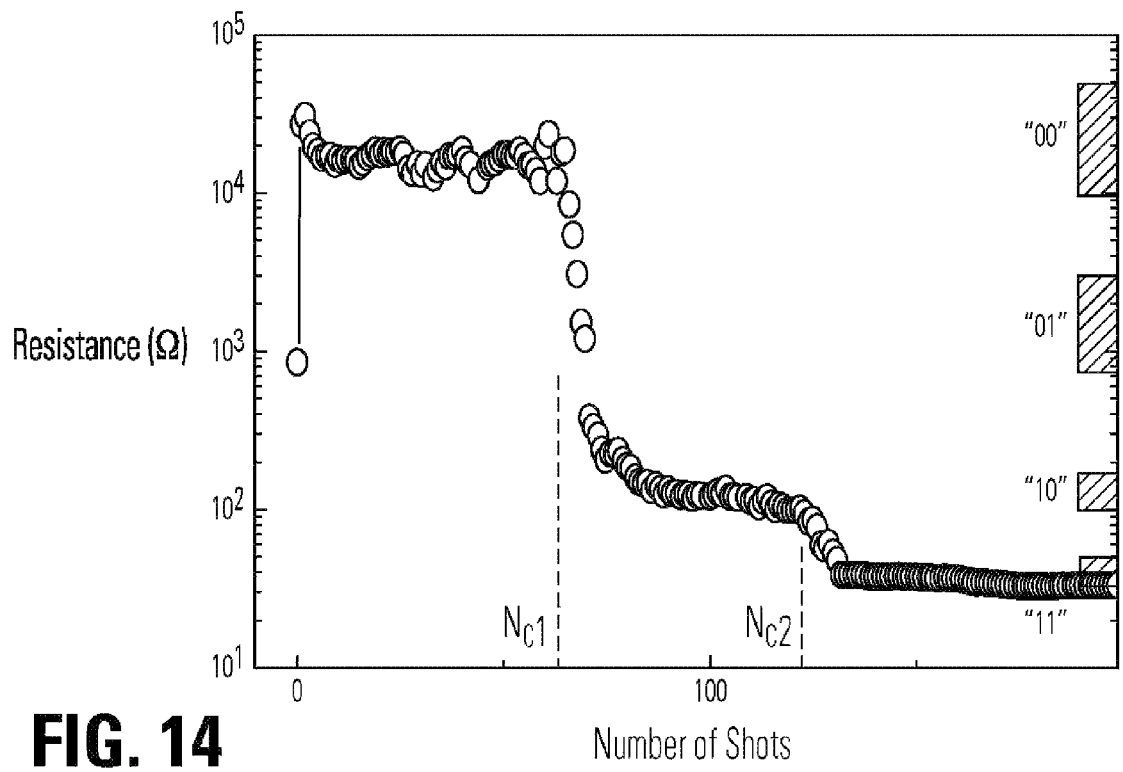

FIG. 14 illustrates the effect the number of program shots (program pulses) applied to the memory cell 10 have on the resistance state of the memory portion 15 and thus the data value stored in the memory cell 10. As can be seen in FIG. 14 the resistance ranges each correspond to a data value ("00", "01", "10", or "11") stored in the memory cell 10, the resistance ranges shown in FIG. 14 collected from a number of memory cells 10. The resistance of the memory cell 10 initially ranges from $8 \times 10^2 \Omega$ to $3 \times 10^3 \Omega$ (the very first data point of FIG. 14, denoted as the "01" state) at a read voltage of less than 100 mV. When a bias voltage that is higher than a critical value is applied for a duration of time to the memory cell 10, the resistance changes by greater than a factor of 10 to approximately $10^4 \Omega$ and is denoted as the "00" state in FIG. 14. The critical value of the bias voltage depends upon the pulse length, with a shorter pulse requiring a higher bias voltage to change the resistance state.

The programming of the resistance states illustrated in FIG. 14 was accomplished using a bias voltage of 1.5 V with a pulse duration of 70 nsec. However, as another example a bias voltage of 3.3 V with a pulse duration of 20 nsec can also be used to program the resistance states.

The "00" resistance state of the memory portion 15 of the memory cell 10 does not change its resistance until a critical number of program shots $N_{c1}$ are applied ($N_{c1}$ being approximately 60 in FIG. 14). Before $N_{c1}$, the "00" resistance stays in the range of between about $1 \times 10^4 \Omega$ and $5 \times 10^4 \Omega$. However, the resistance shows a sharp drop (of approximately a factor of 100, denoted as the "10" state) soon after $N_{c1}$. Similarly, after a second critical number of shots $N_{c2}$ ($N_{c2}$ being approximately 120 in FIG. 14) results in the change from the "10" state to "11" state. In FIG. 14 the resistance range of "10" is between about 100$\Omega$ and 150$\Omega$ and the resistance range of "11" is between about 30$\Omega$ and 50$\Omega$.

Figure 15:
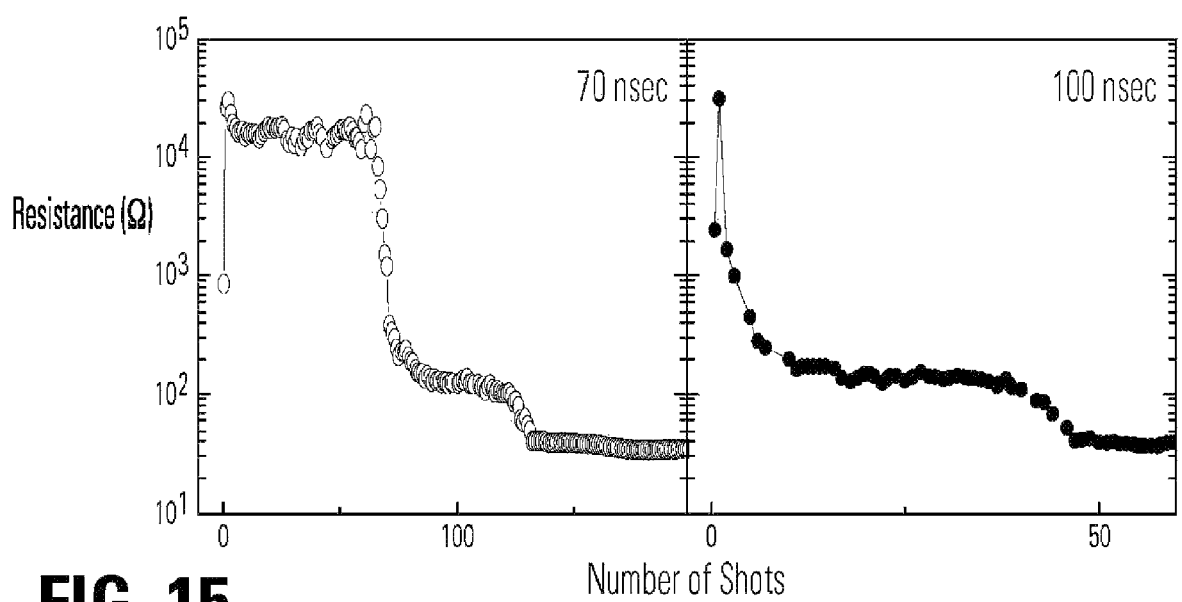

FIG. 15 shows that both $N_{c1}$ and $N_{c2}$ strongly depend on the arrangement of bias voltage and pulse duration. In FIG. 15 the graph on the left is the resistance of the memory cell 10 versus the number of program shots with each program shot having a pulse duration of 70 nsec, while the graph on the right is with a pulse duration of 100 nsec. As can be seen in FIG. 15 a pulse duration of 100 nsec gives a very small $N_{c1}$. Additionally, if the pulse duration is greater than 100 nsec it has been observed that the "00" state disappears after the first programming shot and the resistance goes directly to the "10" state.

Figure 16:
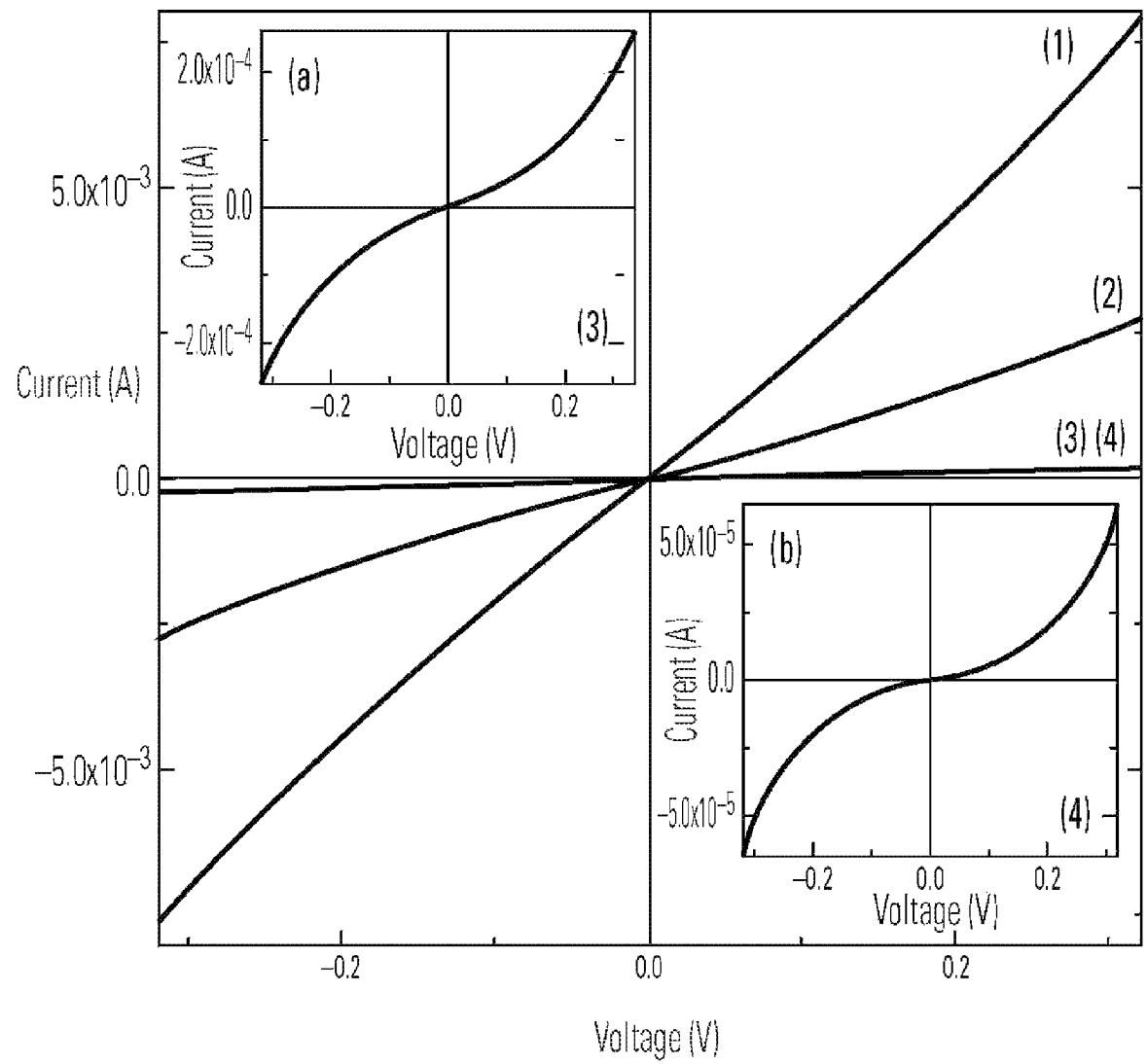

FIG. 16 shows I-V curves (1), (2), (3), and (4) for the respective resistance states "11", "10", "01", and "00" of FIG. 14. The inset (a) of FIG. 16 shows the non-linear I-V curve for state "01" in more detail, the non-linearity coming from the semiconducting properties of the memory portion 15 when in the "01" state. The inset (b) of FIG. 16 shows that the I-V curve when in state "00" is even more non-linear than that of state "01". As can be seen in FIG. 16, current-to-voltage linearity of the memory portion 15 increases as the resistance decreases, with state "11" being closest to Ohm's law (linear I-V relationship).

Figure 17:
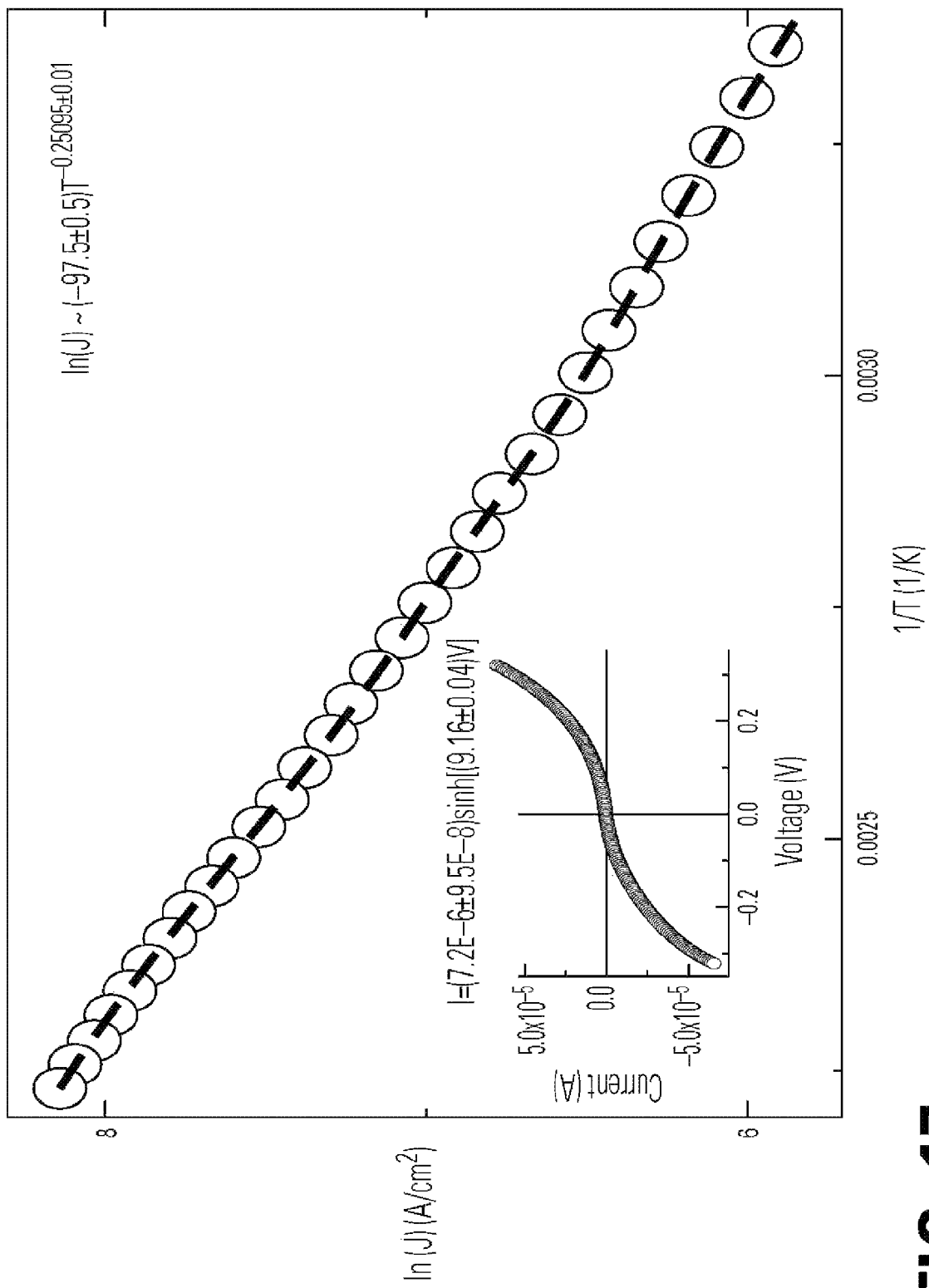

FIG. 17 shows the temperature effect on the current density in the "00" state with an applied voltage near zero volts. The curve is well-fitted by $T^{-1/4}$, suggesting a variable-range hopping VRH conduction mechanism. Additionally, the hyperbolic-sine fitting of the I-V curve in state "00", as shown in the inset of FIG. 17, further strengthens the suggestion of a variable range-hopping conduction mechanism. From FIG. 17 and its inset, the hopping activation energy and the localized density of state can be calculated as approximately 0.4 eV and approximately 1020 eV$^{-1}$ cm$^{-3}$, respectively.

Figure 18:
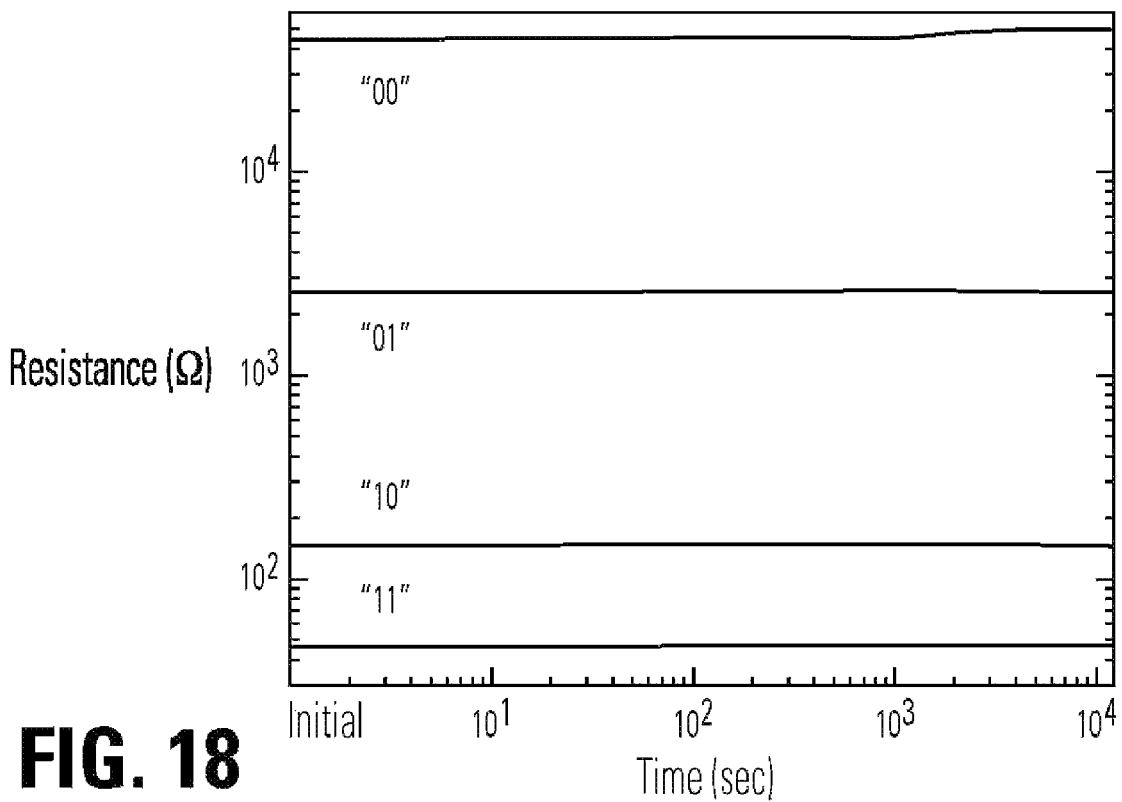
Figure 19:
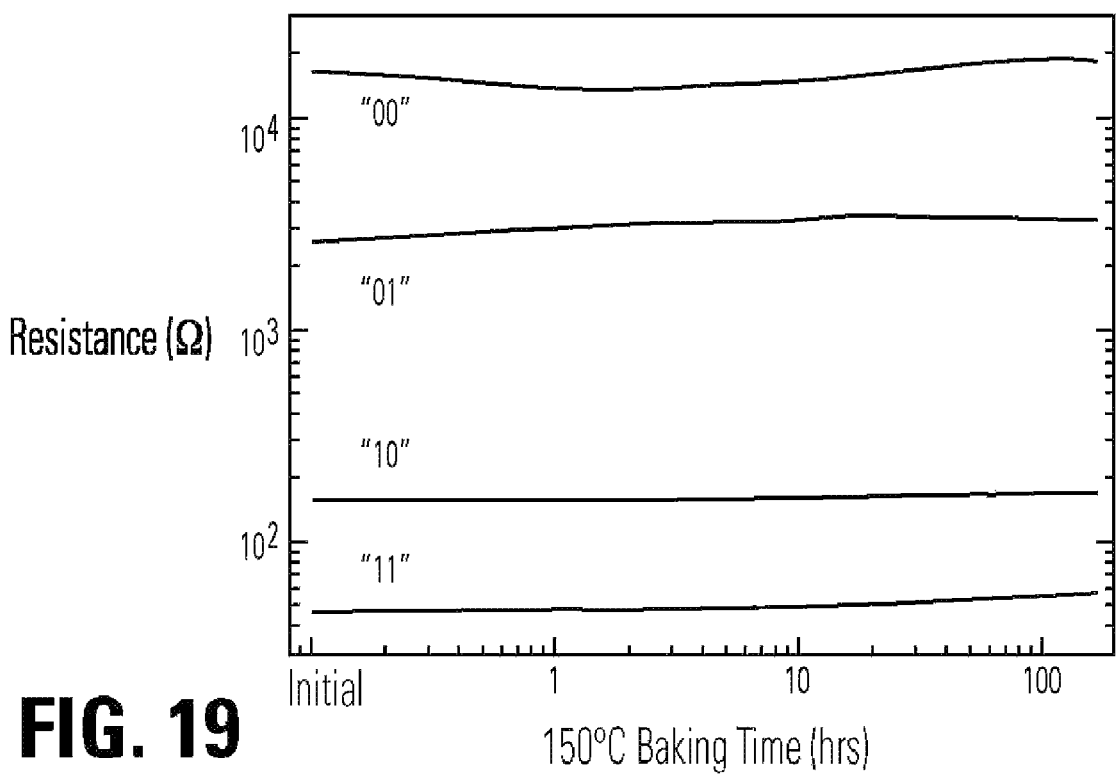

FIGS. 18 and 19 show the room temperature and 150° C. baking of the four resistance states of the memory cell 10. As can be seen in FIG. 19 all the states remain stable even after baking at 150° C. for 1 week.

Figure 20:
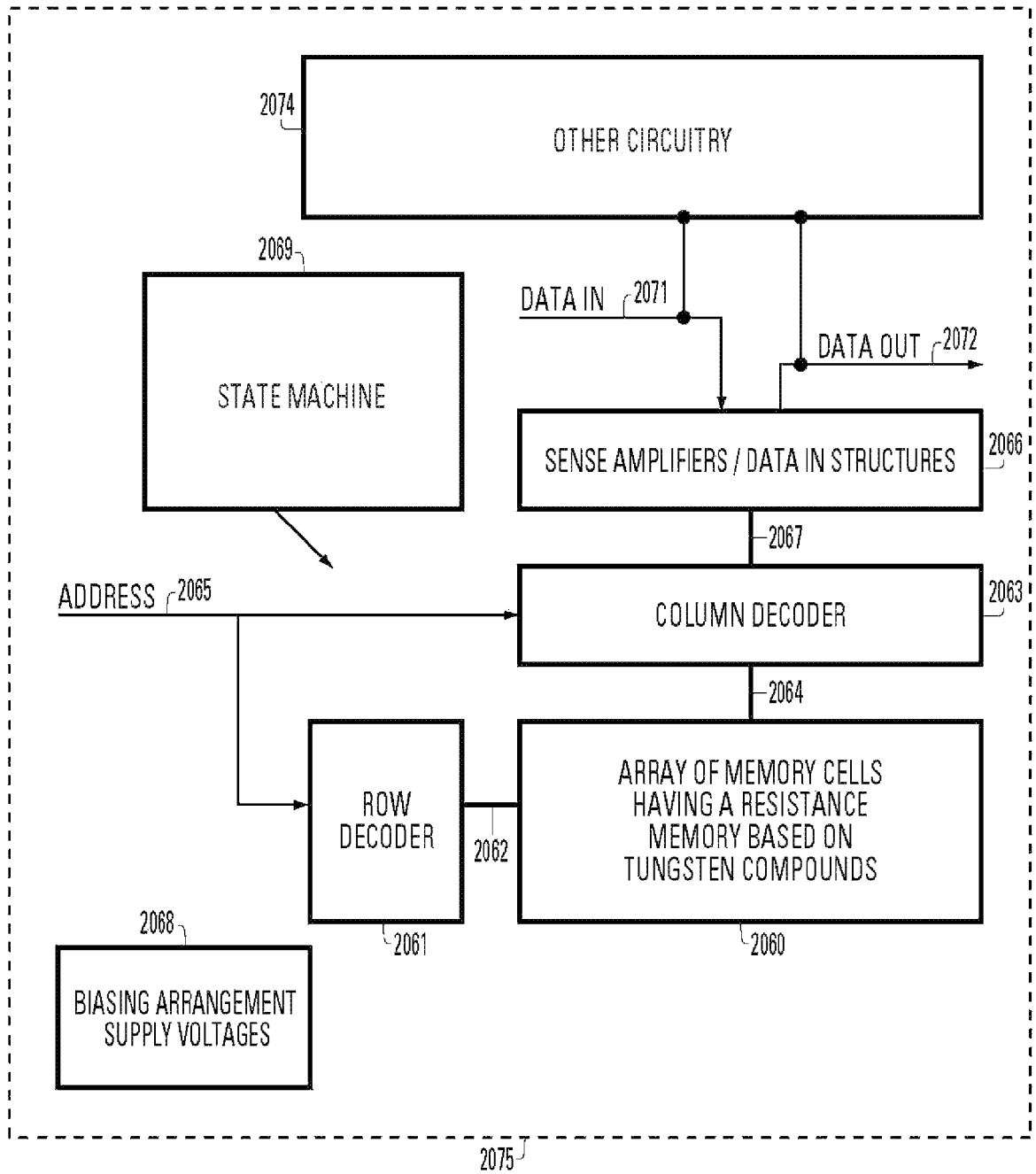
FIG. 20 is a simplified block diagram of an integrated circuit including a memory cell array implemented using embedded resistance memory based on one or more tungsten compounds.

FIG. 20 is a simplified block diagram of an integrated circuit 2075 including a memory cell array 2060 implemented using resistance memory based on one or more tungsten-oxygen compounds. A row decoder 2061 having one or more of each of read, set and reset modes is coupled to a plurality of word lines 2062 arranged along rows in the memory array 2060. A column decoder 2063 is coupled to a plurality of bit lines 2064 arranged along columns in the memory array 2060 for reading, setting and resetting data to the memory cells in the memory array 2060. Addresses are supplied on a bus 2065 to a column decoder 2063 and a row decoder 2061. Sense amplifiers and data-in structures in a block 2066, including current sources for the read, set and reset modes, are coupled to the column decoder 2063 via a data bus 2067. Data is supplied via the data-in line 2071 from input/output ports on the integrated circuit 2075 or from other data sources internal or external to the integrated circuit 2075, to the data-in structures in the block 2066. In the illustrated embodiment, other circuitry 2074 is included on the integrated circuit 2075, such as a general purpose processor or special purpose application circuitry, or a combination of modules providing system-on-a-chip functionality supported by the memory cell array 2060. Data is supplied via the data-out line 2072 from the sense amplifiers in block 2066 to input/output ports on the integrated circuit 2075, or to other data destinations internal or external to the integrated circuit 2075.

A controller utilized in this example using bias arrangement state machine 2069 controls the application of bias arrangement supply voltages 2068, such as read, program, erase, erase verify and program verify voltages. The controller can be implemented using special purpose logic circuitry as known in the art. In alternative embodiments, the controller comprises a general purpose processor, which may be implemented on the same integrated circuit, which executes a computer program to control the operations of the device. In yet other embodiments, a combination of special purpose logic circuitry and a general purpose processor may be utilized for implementation of the controller.

Figure 21:
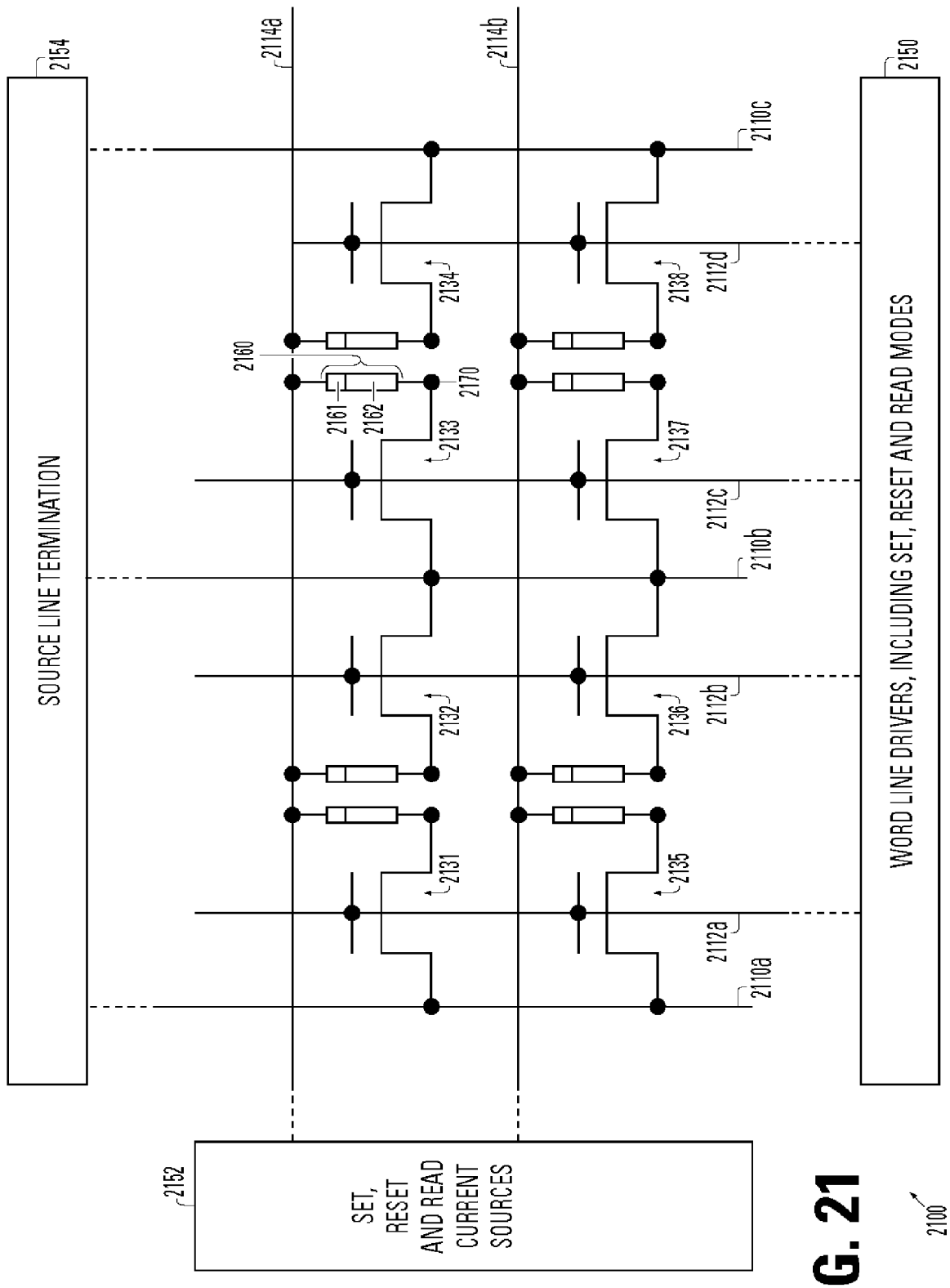
FIG. 21 is a schematic illustration of a memory array implemented using memory cells as described herein.

FIG. 21 is a schematic illustration of a memory array 2100 implemented using memory cells as described herein. Eight memory cells 2131, 2132, 2133, 2134, 2135, 2136, 2137, and 2138 each having respective access transistors and memory elements, each of the memory elements including a tungsten portion and a memory portion self-aligned to the tungsten portion, are illustrated in FIG. 21, representing a small section of an array that can include millions of memory cells.

In the schematic illustration of FIG. 21, common source lines 2110a, 2110b, and 2110c, word lines 2112a, 2112b, 2112c, and 2112d are arranged generally parallel in the y-direction. Bit lines 2114a, 2114b are arranged generally parallel in the x-direction. Thus, a y-decoder and word line driver 2150, having one or more set, reset, and read modes, are coupled to the word lines 2112. Bit line current sources 2152 for one or more set, reset, and read modes, a decoder and sense amplifiers (not shown) are coupled to the bit lines 2114. The common source lines 2110 are coupled to the source line termination circuit 2154, such as a ground terminal. The source line termination circuit 2154 may include bias circuits such as voltage and current sources, and decoding circuits applying bias arrangements, other than ground, to the source lines in some embodiments.

The common source line 2110a is coupled to the source terminals of memory cells 2131, 2135. The common source line 2110b is coupled to the source terminals of memory cells 2132, 2133, 2136, 2137. The common source line 2110c is coupled to the source terminals of memory cells 2134, 2138. The word line 2112a is coupled to the gate terminals of memory cells 2131, 2135. The word line 2112b is coupled to the gate terminals of memory cells 2132, 2136. The word line 2112c is coupled to the gate terminals of memory cells 2133, 2137. The word line 2112d is coupled to the gate terminals of memory cells 2134, 138.

Memory cell 2133 including memory element 2160 is representative. Memory element 2160 couples the drain 2170 of the access transistor of memory cell 2133 to bit line 2114a, the memory element 2160 including a tungsten portion 2161 and a memory portion 2162 self-aligned to the tungsten portion 2161. The memory portion 2162 comprises one or more tungsten-oxygen compounds, and can be programmed to two or more stable resistance values to indicate data stored in the memory cell 2133. In other embodiments, the access transistors can be replaced by diodes, or other structures for controlling current flow to selected devices in the array for reading and writing data.

Figure 22:
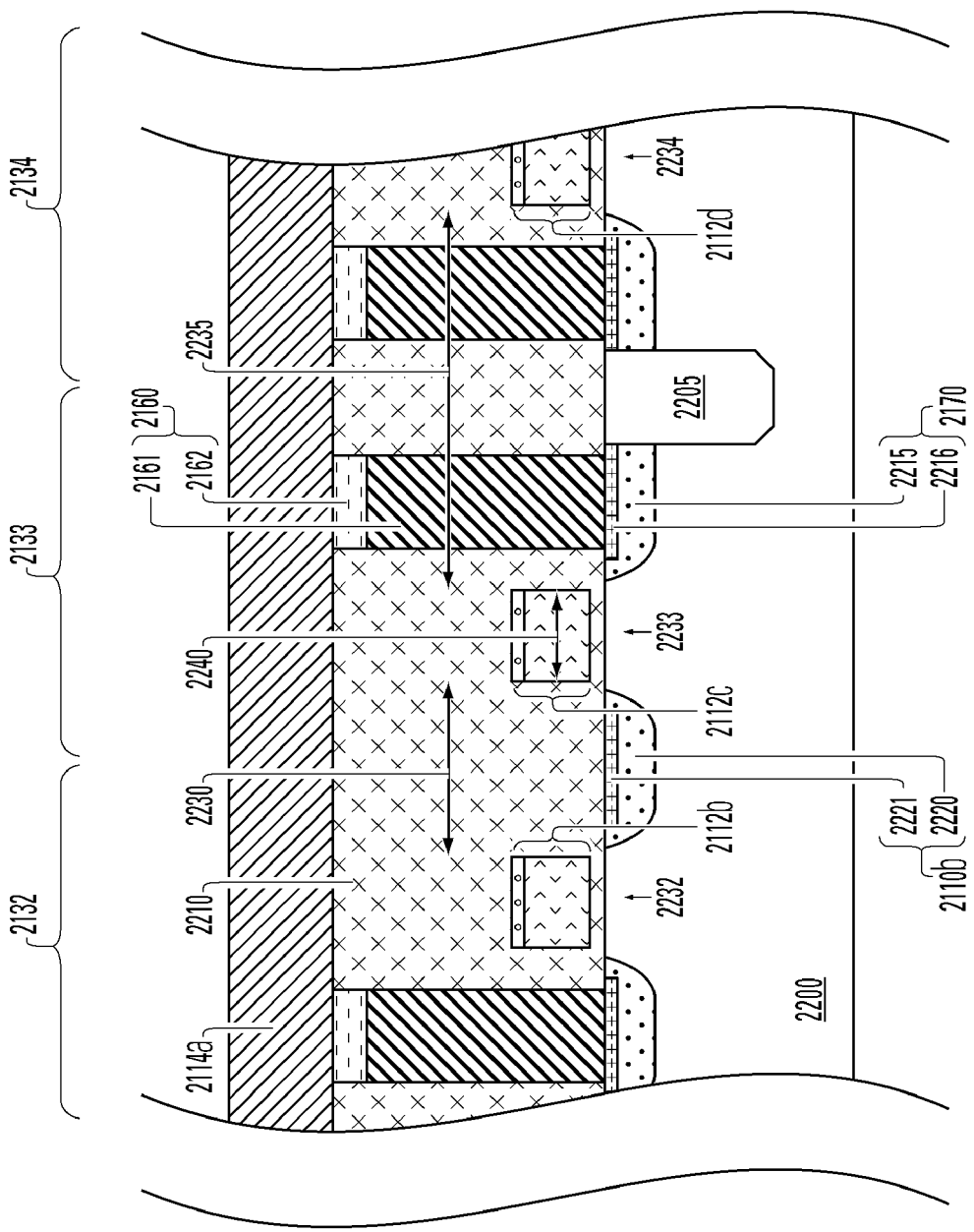
FIG. 22 is a cross-sectional view of a portion of the array of memory cells of FIG. 21 taken orthogonal to word lines.

FIG. 22 is a cross-sectional view of a portion 2290 of the array of memory cells of FIG. 21 taken orthogonal to word lines 2212 and includes memory cells 2132, 2133, and 2134 on a substrate 2200. The memory cells 2132, 2133, and 2134 include respective access transistors 2232, 2233, and 2234.

The word lines 2112 having word line widths 2240 form the gates of the access transistors in the memory cells and extend in parallel in a direction into and out of the plane of the cross-section illustrated in FIG. 22.

In the illustrated embodiment the word lines 2112 each comprise a second conductive layer on a first conductive layer, the second conductive layer in some embodiments comprising a silicide such as cobalt silicide $CoSi_x$. In alternative embodiments the word lines 2112 each comprise a single conductive layer.

Doped region 2215 and conductive layer 2216 form the drain 2170 of the access transistor 2233 of memory cell 2133, the conductive layer 2216 omitted in some embodiments. Shallow trench isolation structure 2205 comprising dielectric material extends into the substrate 2200 and separates the drain 2170 from the drain of the access transistor 2234 of memory cell 2134.

Doped region 2220 and conductive layer 2221 form the common source line 2110b and act as the source region for both the access transistor 2232 of memory cell 2132 and the access transistor 2233 of memory cell 2133. In some embodiments the conductive layer 2221 is omitted. The source line 2110b extends in a direction parallel to the word lines 2112. The source line 2110b may also include a conductive line or a contact coupled to the doped region 2220 in some embodiments.

Memory element 2160 extends through dielectric 2210 and couples the drain 2170 of the access transistor 2233 of memory cell 2133 to the bit line 2114a, the bit line 2114a extending in a direction perpendicular to the word lines 2112. The memory element 2160 includes a tungsten portion 2161 and an embedded memory region 2162 self-aligned to the tungsten portion 2161. The memory region 2162 comprises one or more tungsten-oxygen compounds, and can be programmed to two or more stable resistance ranges which indicate data stored in the memory cell 2133.

Word lines 2112b and 2112c are separated by a first separation distance 2230, and word lines 2112c and 2212d are separated by a second separation distance 2235.

Figure 23:
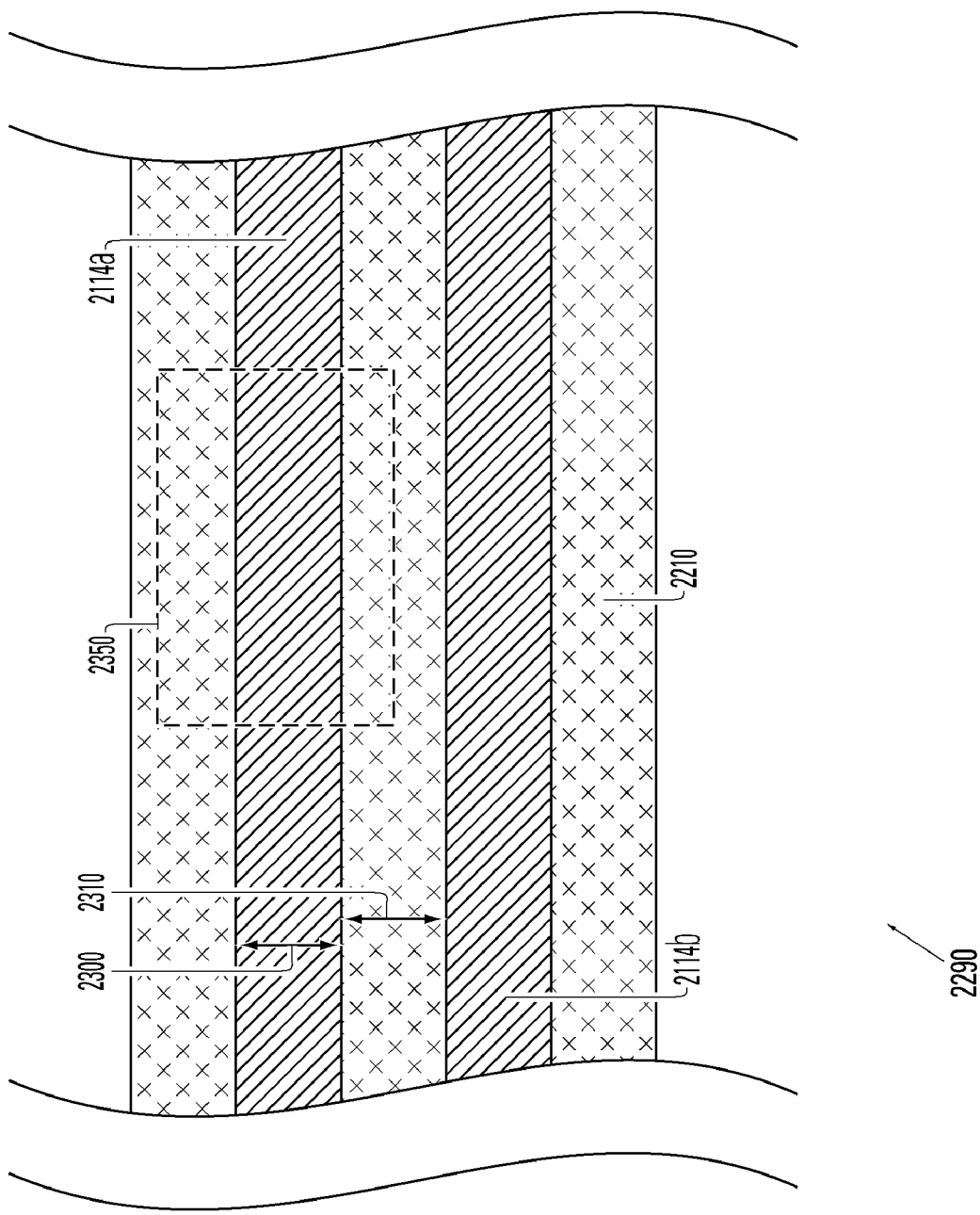
FIG. 23 illustrates a top view of the embodiment illustrated in FIG. 22.

FIG. 23 illustrates a top, or plan, view of the embodiment illustrated in FIG. 22. The bit lines 2114 having bit line widths 2300 extend in parallel and are separated by a bit line separation distance 2310. The bit lines 2114 comprise a barrier material on the memory elements preventing movement of metal-ions from the bit lines 2114 into the memory elements.

The bit lines 2114 may comprise one or more layers of materials, for example comprising materials as discussed above with reference to the top electrode 12 of FIG. 1.

In preferred embodiments the summation of the two word line widths 2240 and the first separation distance 2230 equal about three times a feature size F, and F preferably being a minimum feature size for a lithographic process used to create the word lines 2112, bit lines 2214 and memory elements. Additionally, preferably the second separation distance 2235 is equal to about three times the feature size F, and the summation of the bit line width 2300 and the bit line separation distance 2310 equal twice the feature size F. Thus two cells preferably occupy an area of 6 F-by-2 F, such that each memory cell has an area 2350 equal to 6 $F^2$.

Figure 24:
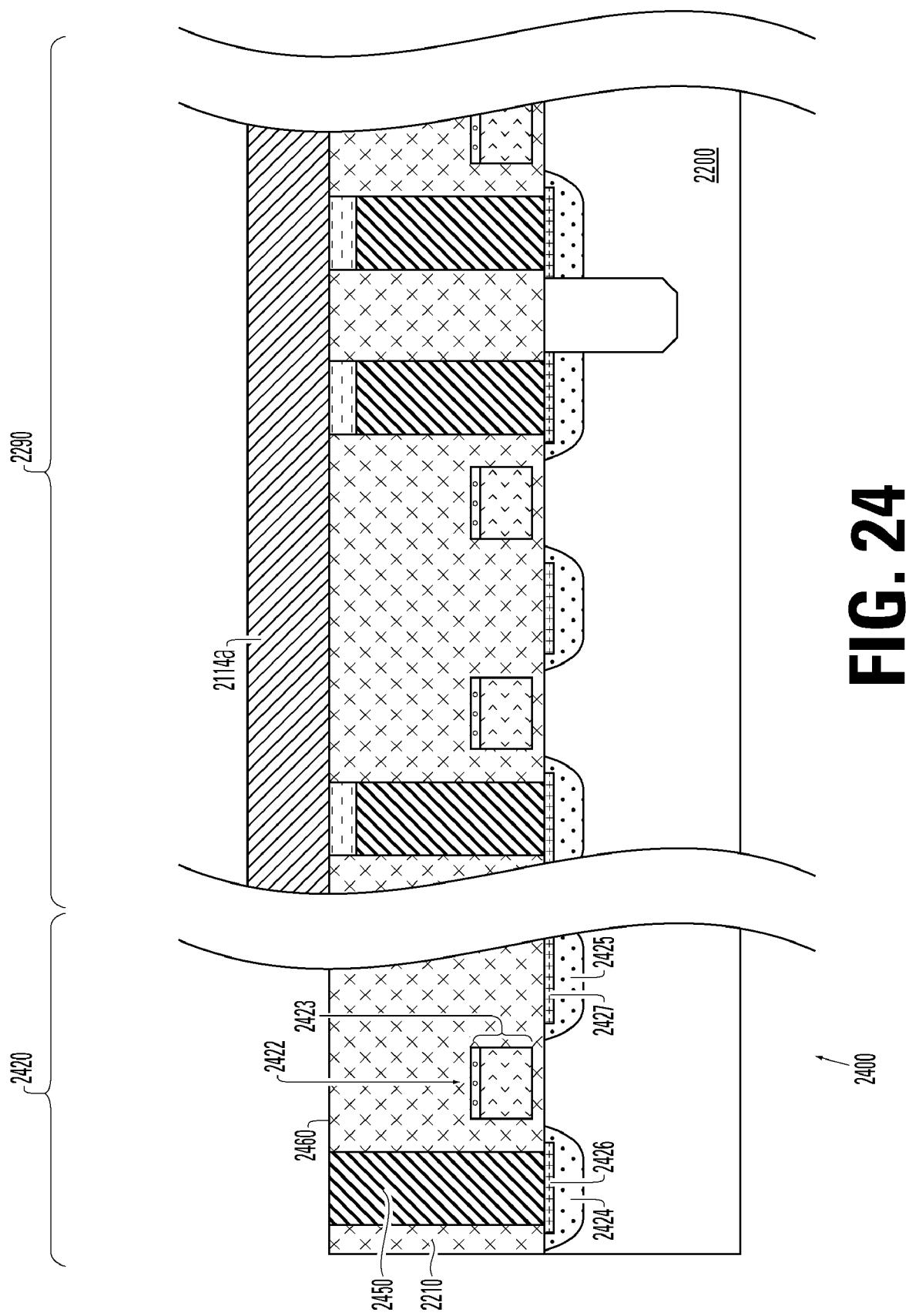
FIG. 24 illustrates a cross-sectional view of a memory device having a memory region and a periphery region on a substrate.

FIG. 24 is a cross-sectional view of a memory device 2400 having the memory region 2290 and a periphery region 2420 on the substrate 2200. The periphery region 2420 includes logic device 2422 having a gate structure 2423 overlying the substrate 2200, and doped regions 2424, 2425 acting as the drain and source regions respectively. The gate structure 2423 comprises a first conductive layer and an optional second conductive layer on the first conductive layer, the second conductive layer comprising for example cobalt silicide. Optional silicide layers 2426, 2427, comprising for example cobalt silicide, respectively contact the doped regions 2424, 2425. Conductive plug 2450 comprising tungsten is coupled to the drain of logic device 2422 and extends to the top surface 2460 of dielectric 2210.

FIGS. 25-28 illustrate a manufacturing method in accordance with a first embodiment, the manufacturing method resulting in forming the memory device 2400 illustrated in FIG. 24.

Figure 25:
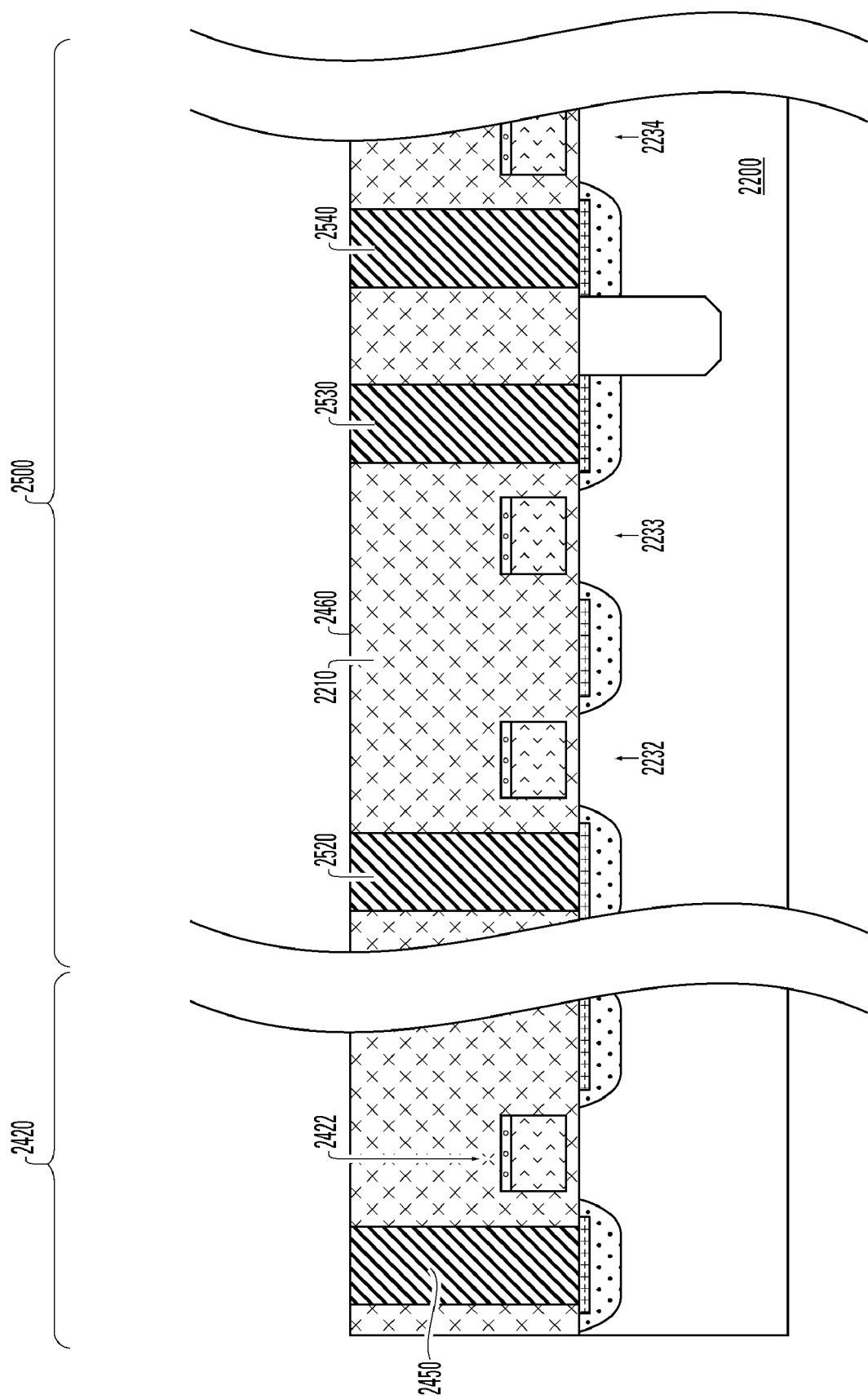
FIG. 25-28 illustrate a manufacturing method in accordance with a first embodiment, the manufacturing method resulting in forming the memory device illustrated in FIG. 24.

FIG. 25 illustrates a first step of providing a subassembly including the periphery region 2420 and a memory cell region 2500 on the substrate 2200.

The memory cell region 2500 includes conductive plugs 2520, 2530, and 2540 each coupled to drain regions of respective access transistors 2232, 2233, and 2234. The plugs 2520, 2530, and 2540 comprise tungsten and extend to the top surface 2460 of dielectric 2210. The top surface 2460 can be formed by example, by a Chemical Mechanical Polishing CMP step after the formation of the plugs 2450, 2520, 2530, 2540 in vias in the dielectric 2210.

Figure 26:
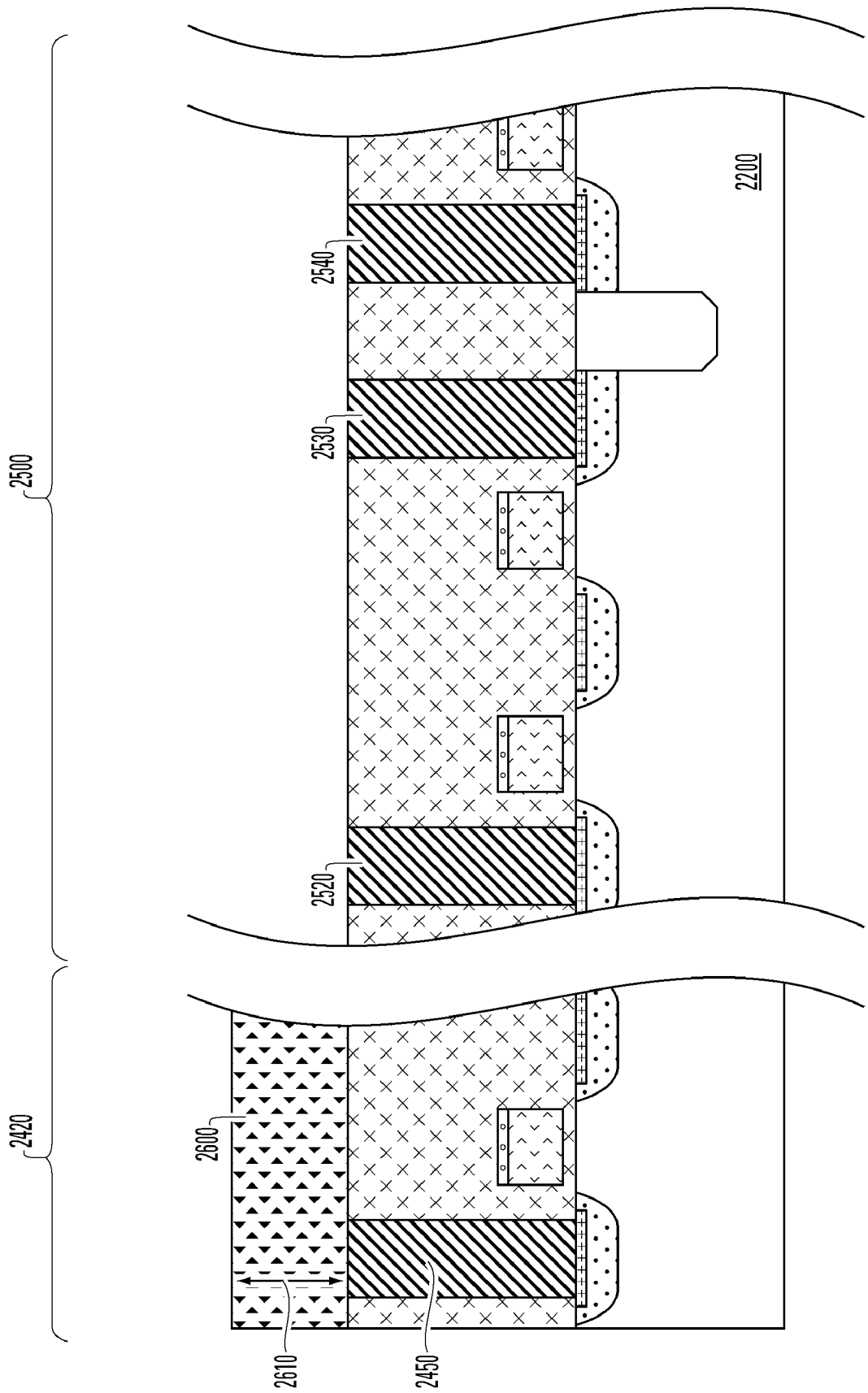

Next, a layer of photoresist 2600 is formed on the periphery region 2420 of the structure illustrated in FIG. 25, resulting in the structure illustrated in FIG. 26. The photoresist 2600 has a thickness 2610 sufficient to prevent damage to the tungsten plug 2450 in the periphery region 2420 during subsequent process steps. In one embodiment, the thickness 2610 is between about 4000 Angstroms and about 100,000 Angstroms. The photoresist 2600 can be formed using a non-critical mask and can have a placement tolerance in the range of several micrometers (μm) to several tens of micrometers.

Figure 27:
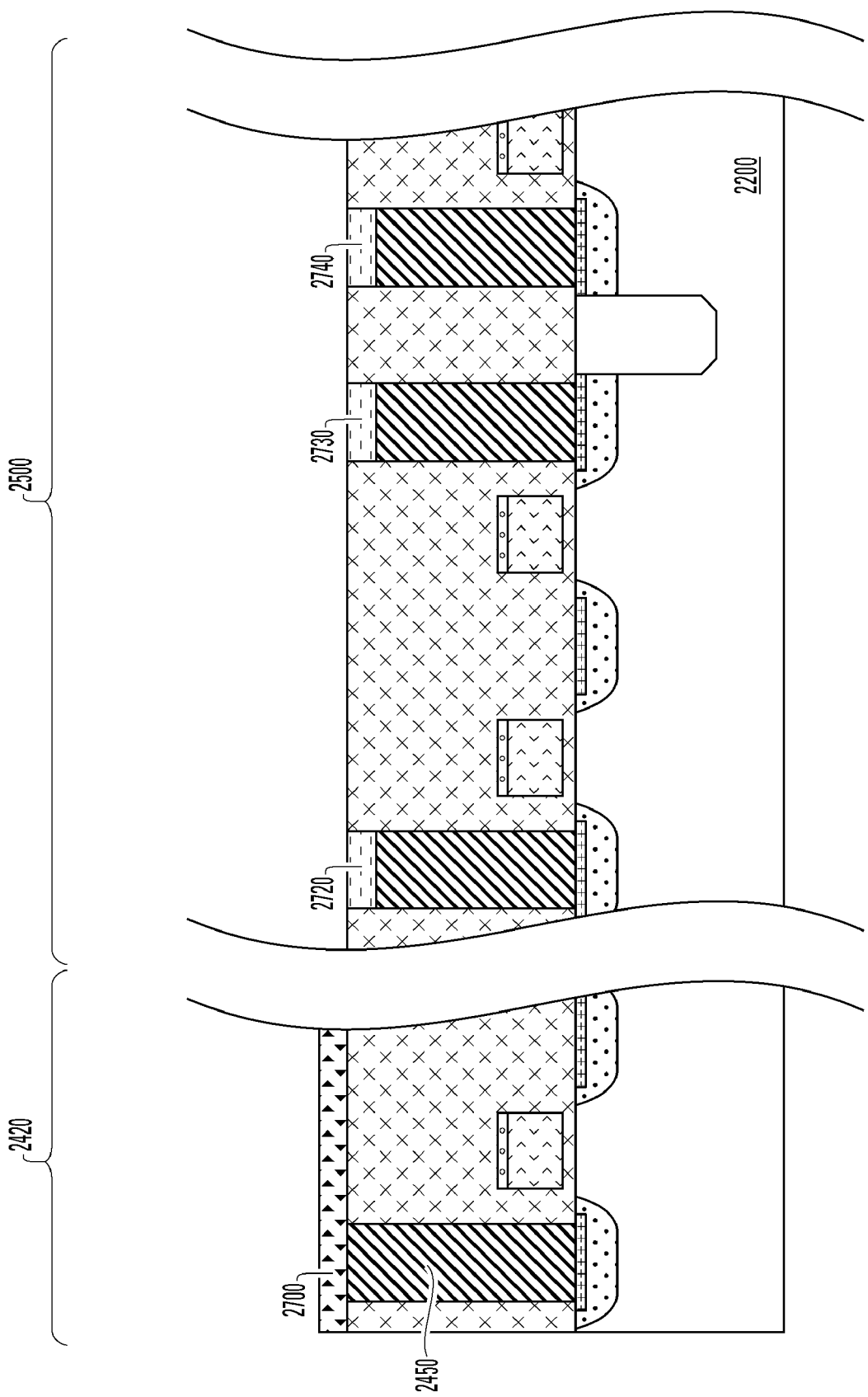

Next, an oxygen ($O_2$) plasma strip is performed on the structure illustrated in FIG. 26, resulting in the structure illustrated in FIG. 27. The process of the oxygen plasma strip removes a portion of the photoresist (FIG. 4, ref. num. 2600), leaving a remaining photoresist residue 2700 on the periphery region 2420 such that the tungsten plug 2450 is not damaged during the oxygen plasma strip. The oxygen plasma strip also forms the memory portions 2720, 2730, and 2740 from the tungsten material of the plugs 2520, 2530, and 2540, the memory portions comprising one or more tungsten-oxygen compounds.

Embodiments of the plasma strip process include a pure $O_2$ gas chemistry, or mixed chemistries such as $O_2/N_2$ or $O_2/N_2/H_2$. The pure $O_2$ gas chemistry combined with a plasma strip technique can be carried out by a direct plasma where the plasma is directly generated in a reaction chamber with reactive gases, a magnetic field enhanced reactive ion plasma, or a down-stream plasma where the plasma source is generated from a reactor out of a reaction chamber and is transferred by a wave-guide tube from a reactor to a reaction chamber. In one embodiment of the down-stream plasma, the down-stream plasma is applied with a pressure of about 1500 mtorr, a power of about 1000 W, an $O_2/N_2$ flow of about 3000 sccm/200 sccm, a temperature of about 150° C., and a time duration of about 400 seconds.

Figure 28:
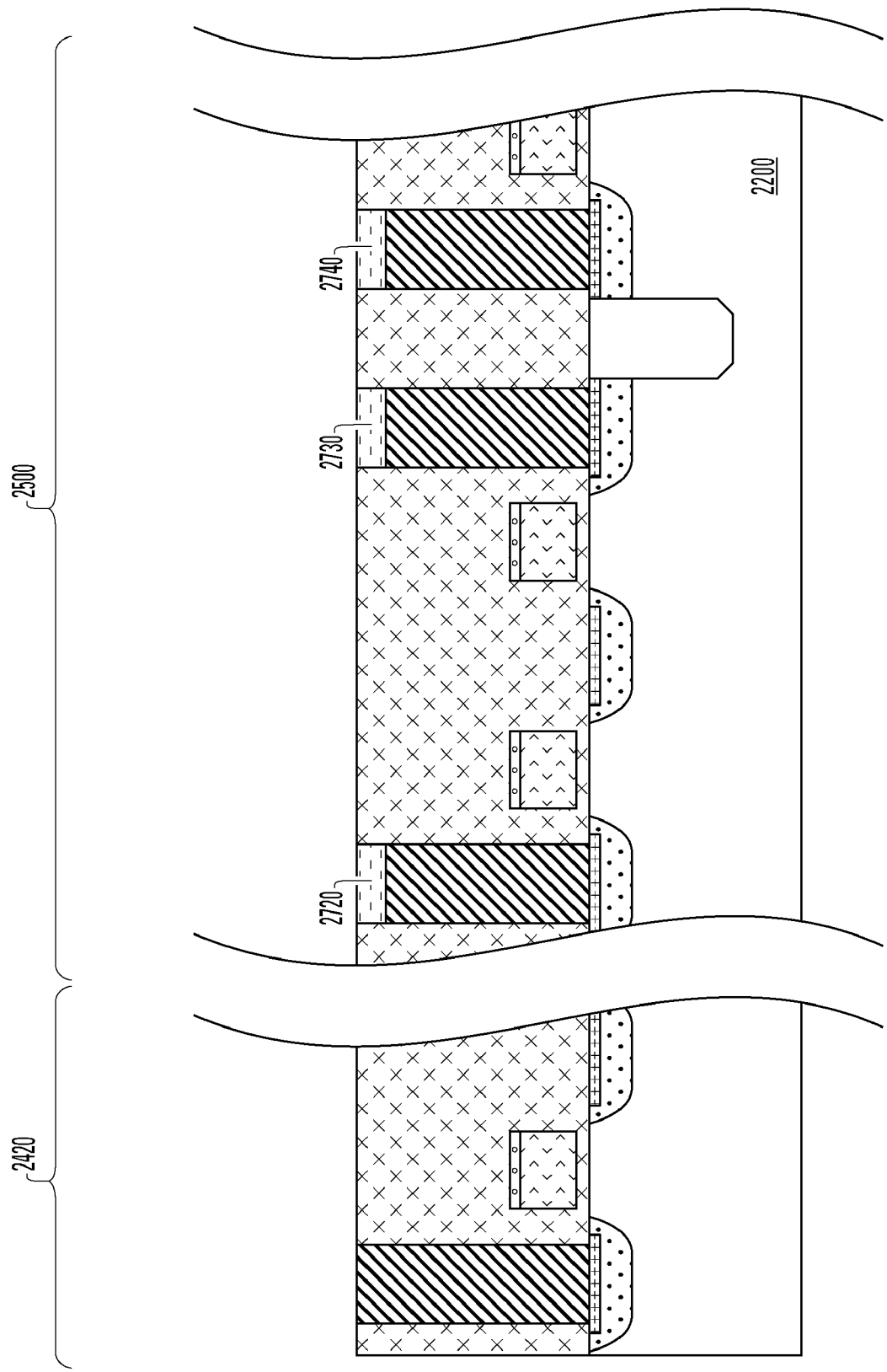

Next, the photoresist residue 2700 is removed by a wet strip process, resulting in the structure illustrated in FIG. 28. Suitable chemicals for the wet strip are aqueous organic mixtures such as EKC265, or other types of the same or similar mixtures.

Next, bit line material comprising a barrier material is patterned on the memory cell region 2500 of the structure illustrated in FIG. 28 to form bit line 2114 in contact with memory regions 2720, 2730, and 2740, resulting in the memory device 2400 of FIG. 24.

FIGS. 29-32 illustrate a manufacturing method in accordance with a second embodiment.

Figure 29:
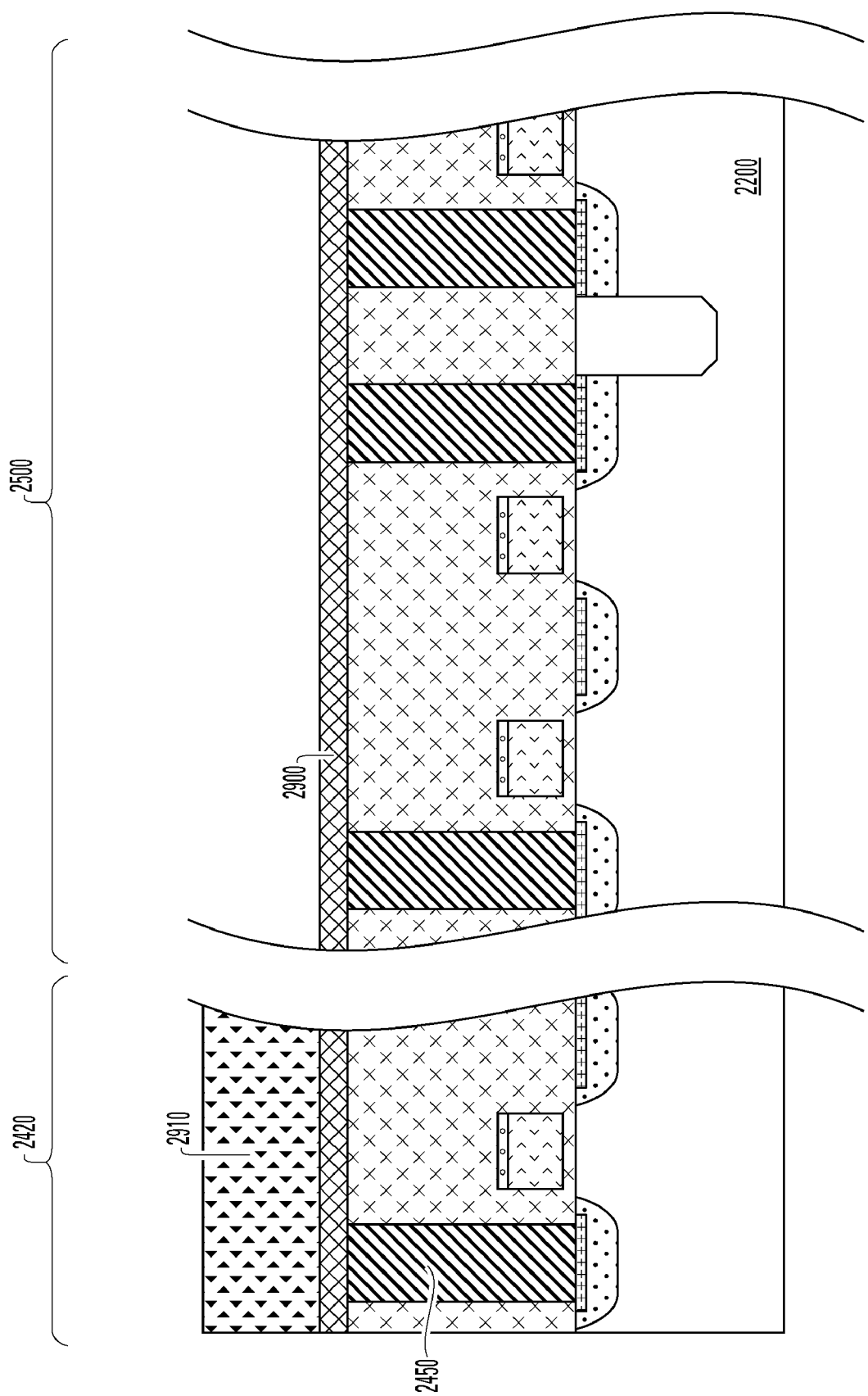
FIGS. 29-32 illustrate a manufacturing method in accordance with a second embodiment.

A dielectric layer 2900 is formed on the top surface 2460 of the dielectric 2210 of the structure illustrated in FIG. 25, and a layer of photoresist 2910 is formed on the portion of the dielectric layer 2900 overlying the logic portion 2420, resulting in the structure illustrated in FIG. 29.

Figure 30:
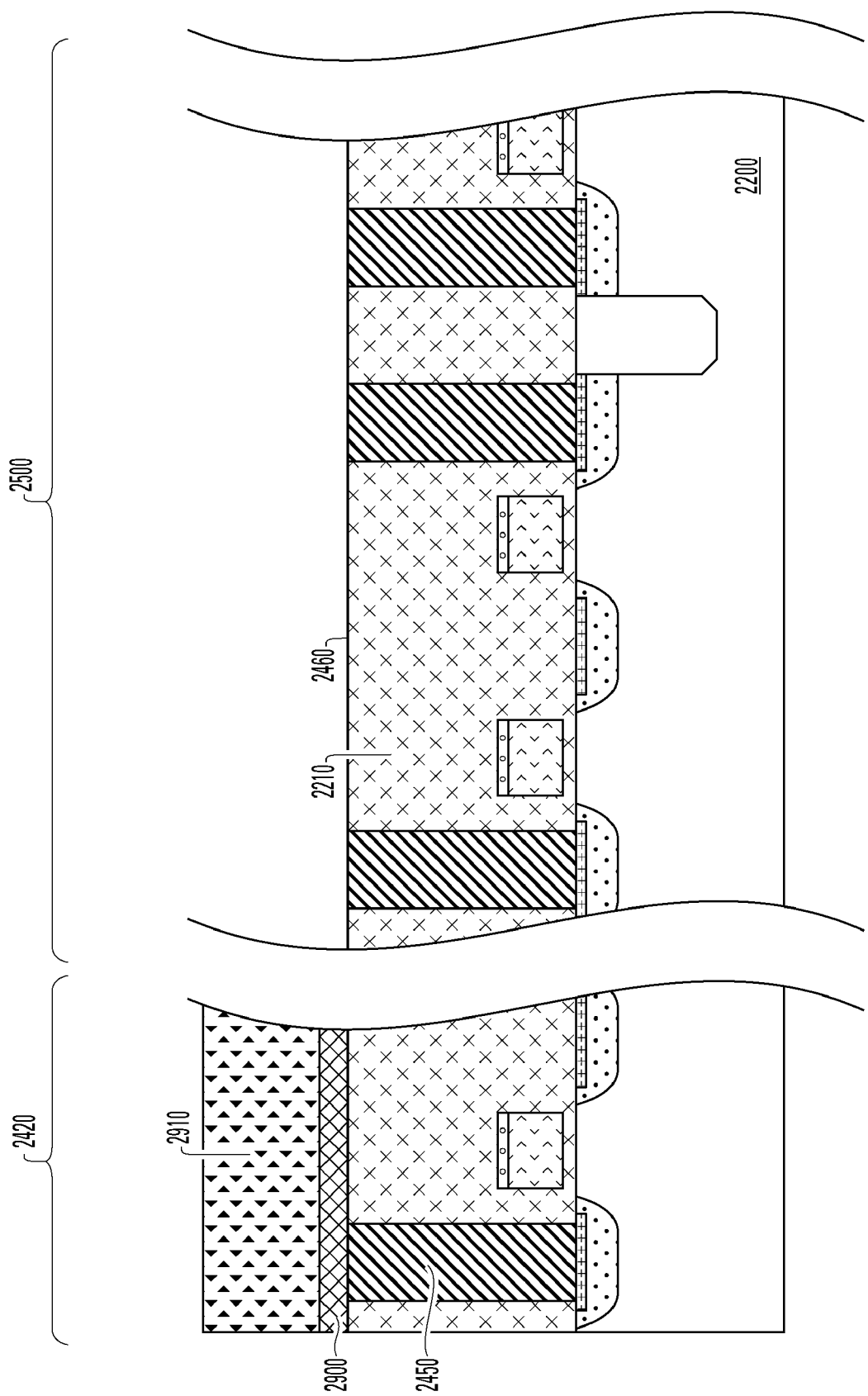

Next, the dielectric layer 2900 is etched using the photoresist 2910 as a mask, thereby exposing the top surface 2460 of the dielectric 2210 in the memory cell region 2500, resulting in the structure illustrated in FIG. 30.

Figure 31:
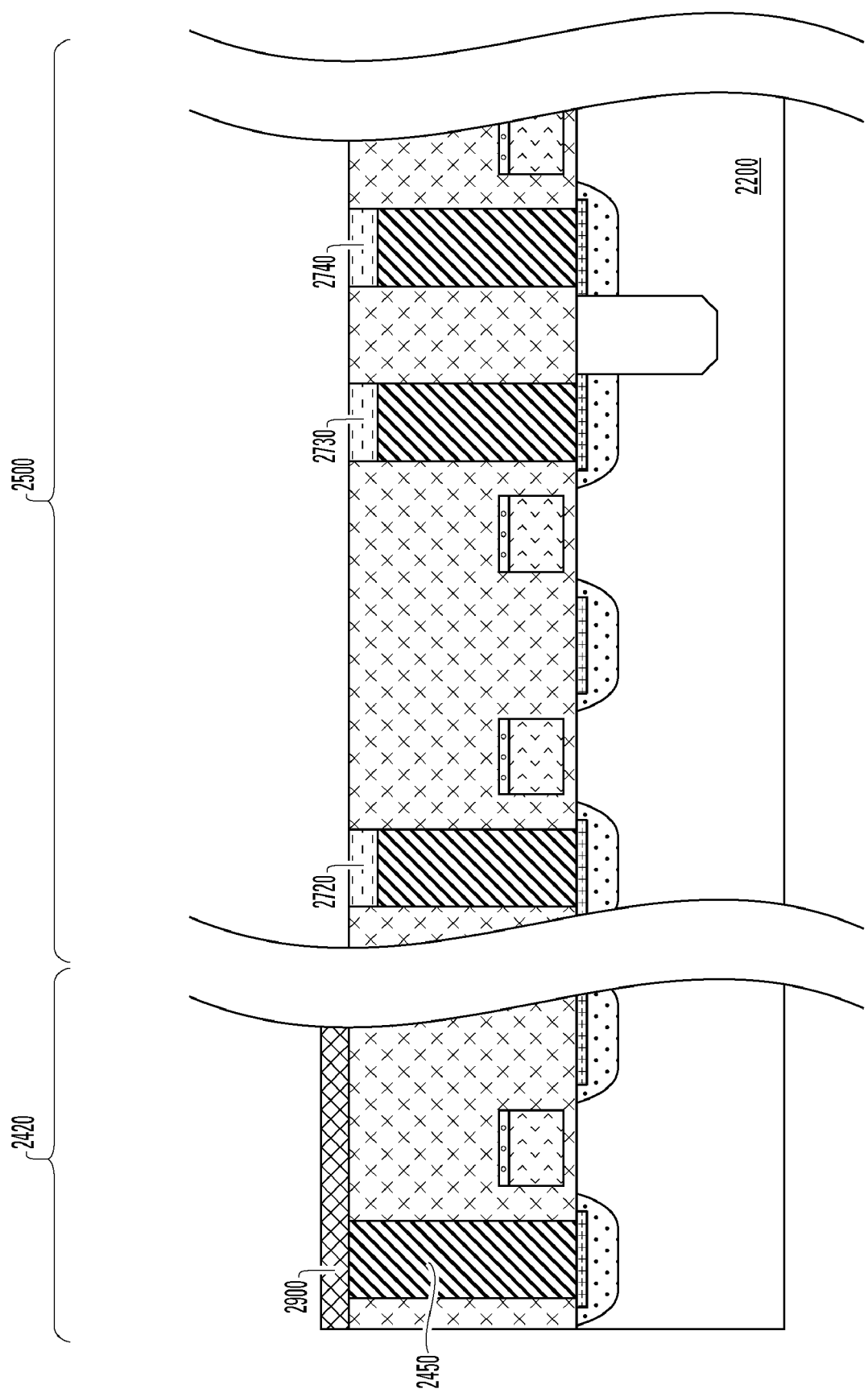

Next, an oxygen plasma strip is performed to form the memory portions 2720, 2730, and 2740 from the tungsten material of the plugs 2520, 2530, and 2540 and a wet strip process removes any remaining photoresist 2910, resulting in the structure illustrated in FIG. 31.

Next, an optional post furnace oxidation step is performed on the structure illustrated in FIG. 31. Because the plug 2450 in the periphery region 2420 is passivated by the dielectric layer 2900, the plug 2450 will not be affected by a furnace oxidation step.

Figure 32:
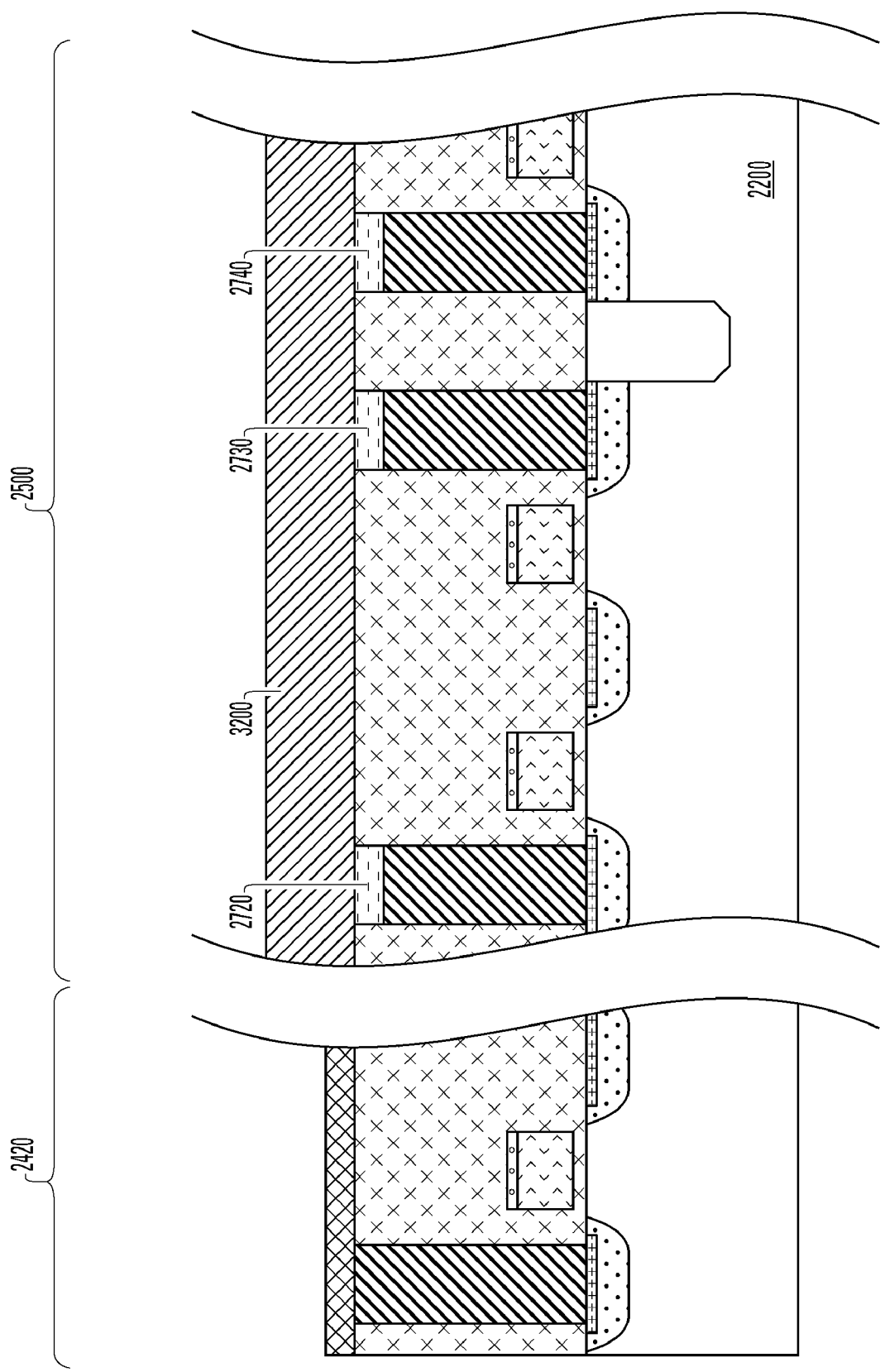

Next, bit line material comprising a barrier material is patterned on the memory cell region 2500, resulting in the memory device illustrated in FIG. 32 having a bit line 3200 in contact with the memory portions 2720, 2730, 2740.

FIGS. 33-36 illustrate a manufacturing method in accordance with a third embodiment.

Figure 33:
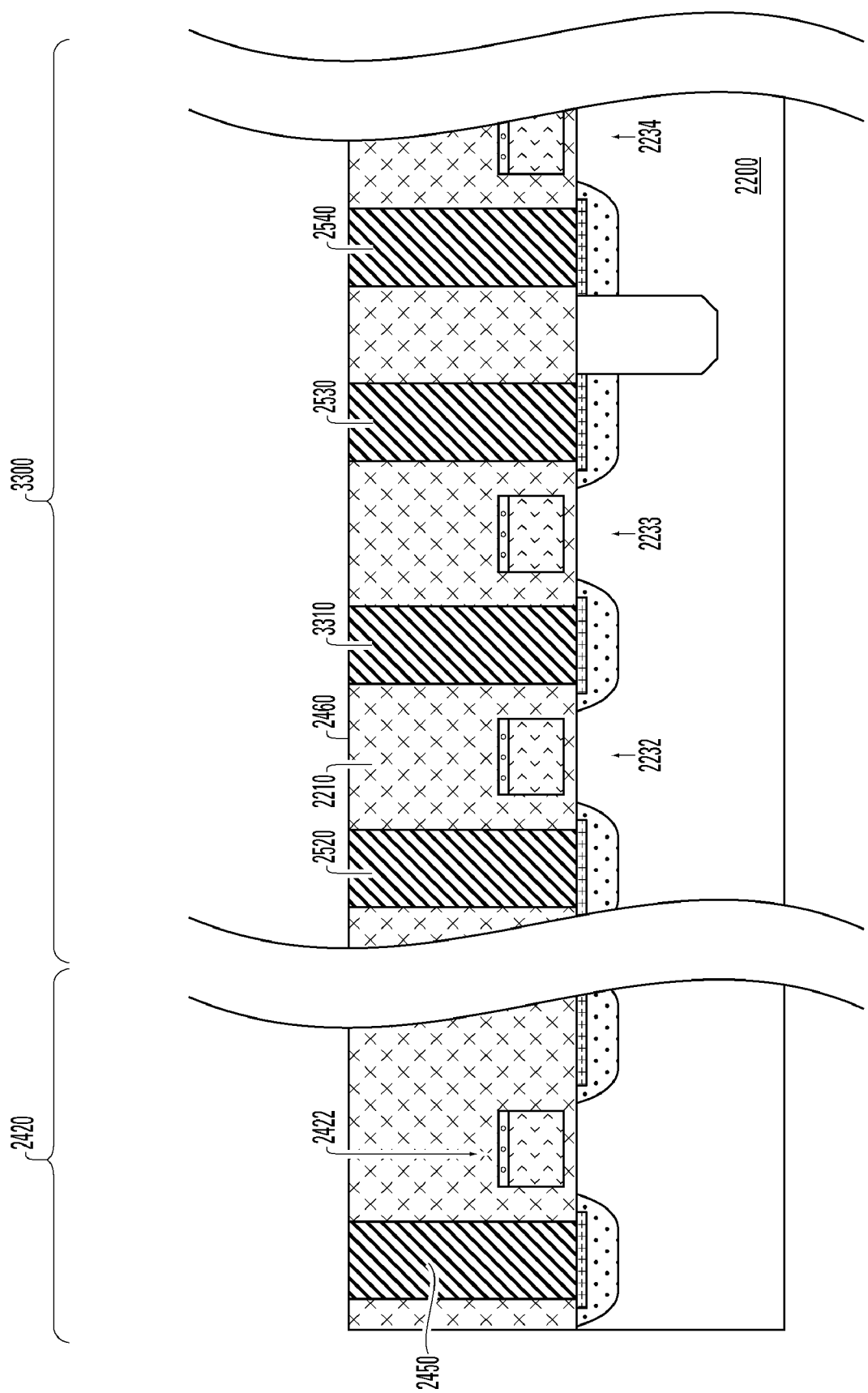
FIGS. 33-36 illustrate a manufacturing method in accordance with a third embodiment.

FIG. 33 illustrates a first step of providing a sub-assembly including the periphery region 2420 and a memory cell region 3300 on the substrate 2200.

The memory cell region 3300 includes conductive plugs 2520, 2530, and 2540 each coupled to the drain regions of respective access transistors 2232, 2233, and 2234. The memory cell region 3300 also includes a common source line 3310 coupled to the common source region of the access transistors 2232, 2233, the common source line 3310 extending in a direction into and out of the cross-section illustrated in FIG. 33.

The plugs 2450, 2520, 2530, 2540 and line 3310 comprise tungsten and extend to the top surface 2460 of dielectric 2210. The top surface 2460 can be formed, for example, by a Chemical Mechanical Polishing CMP step after the formation of the plugs 2450, 2520, 2530, 2540 and line 3310 in the dielectric 2210.

Figure 34:
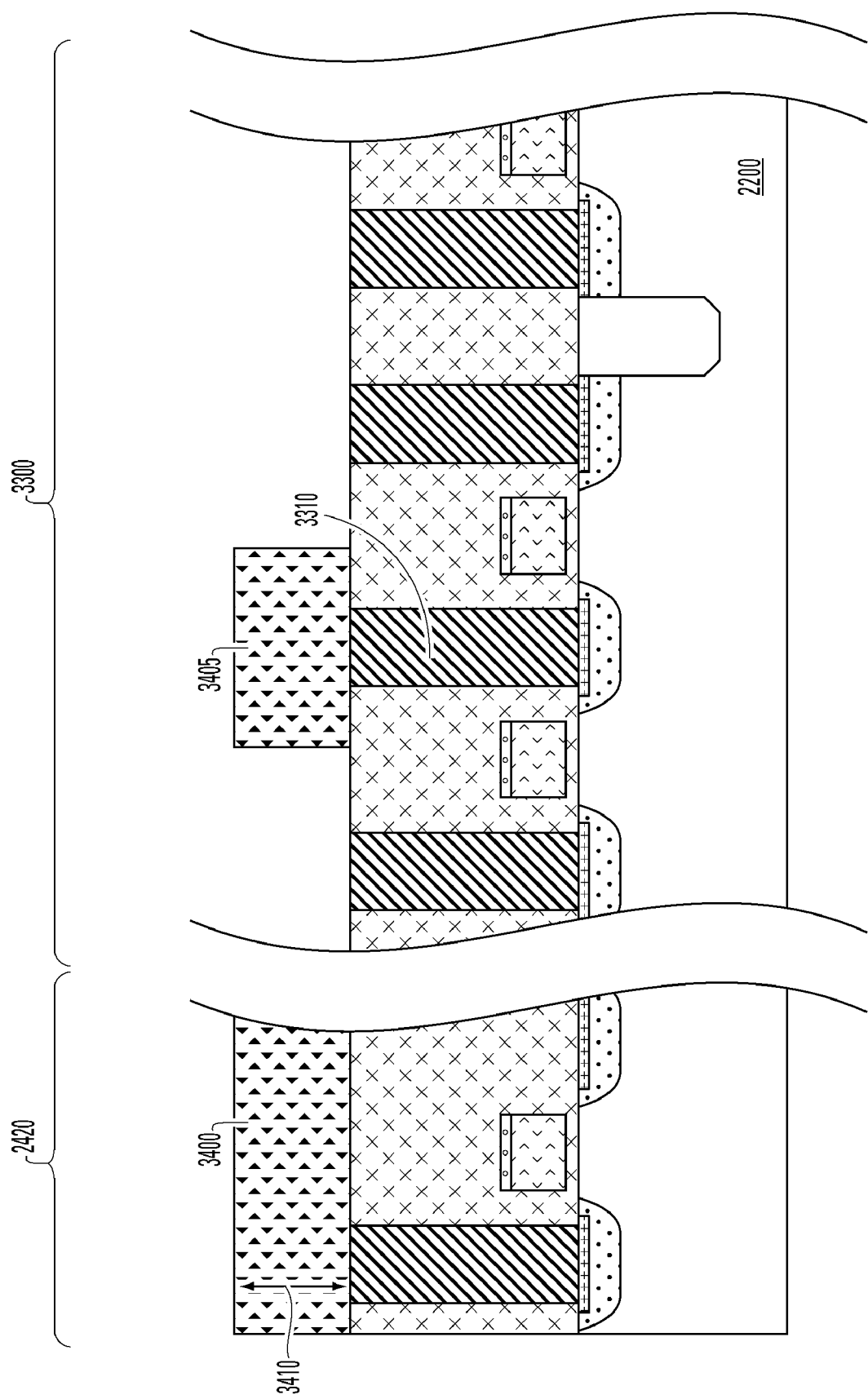

Next, a layer of photoresist is patterned on the structure illustrated in FIG. 33, resulting in the structure illustrated in FIG. 34 having photoresist 3400 on the periphery region 2420 and photoresist 3405 on the common source line 3310.

The photoresist 3400, 3405 has a thickness 3410 sufficient to prevent damage to the plug 2450 and the line 3310 during subsequent process steps.

Next, an oxygen plasma strip followed by a wet strip process is performed to remove the photoresist 3400, 3405 and form the memory portions 2720, 2730, and 2740 from the tungsten material of the plugs 2520, 2530, and 2540.

Figure 35:
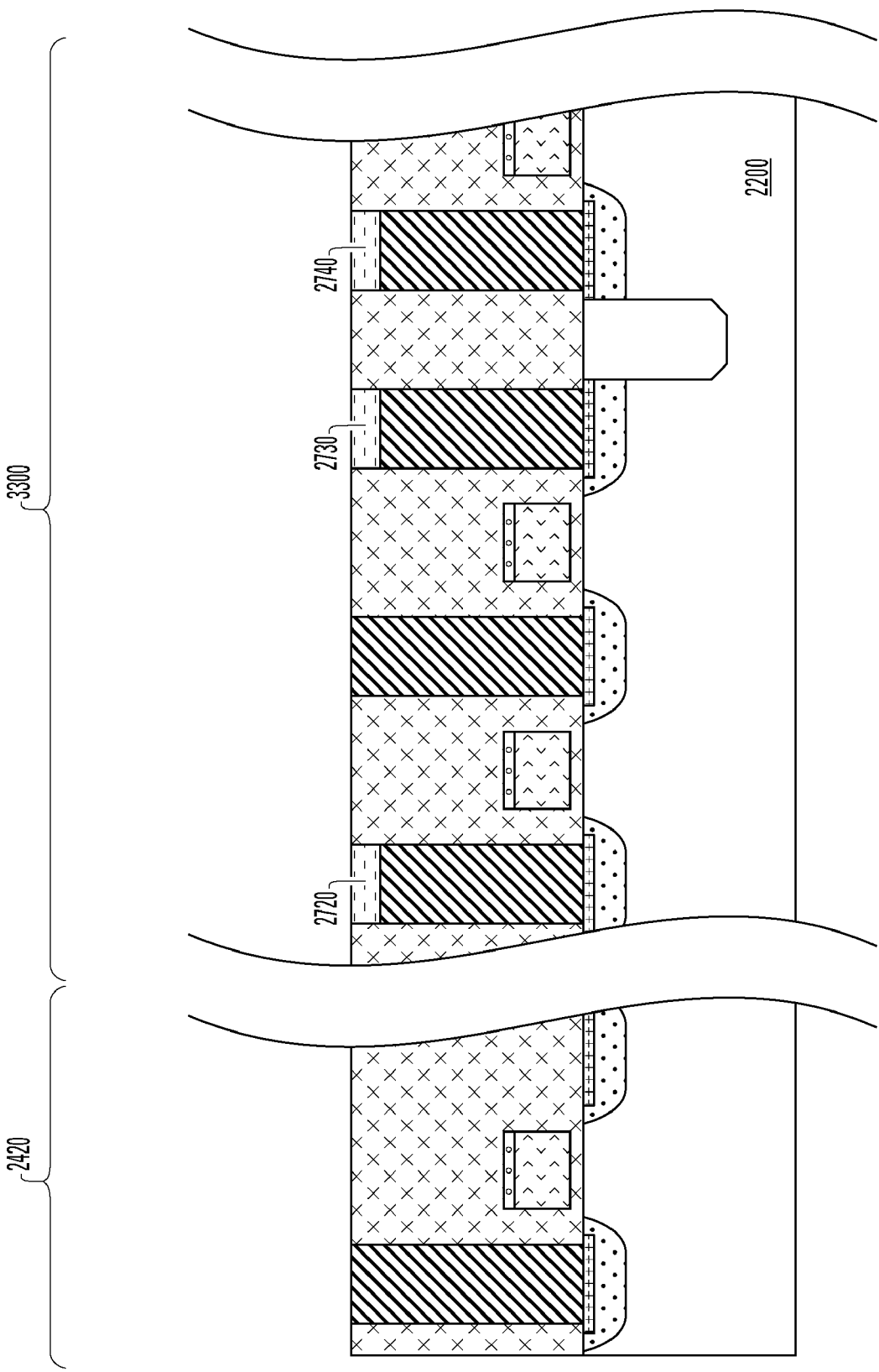
Figure 36:
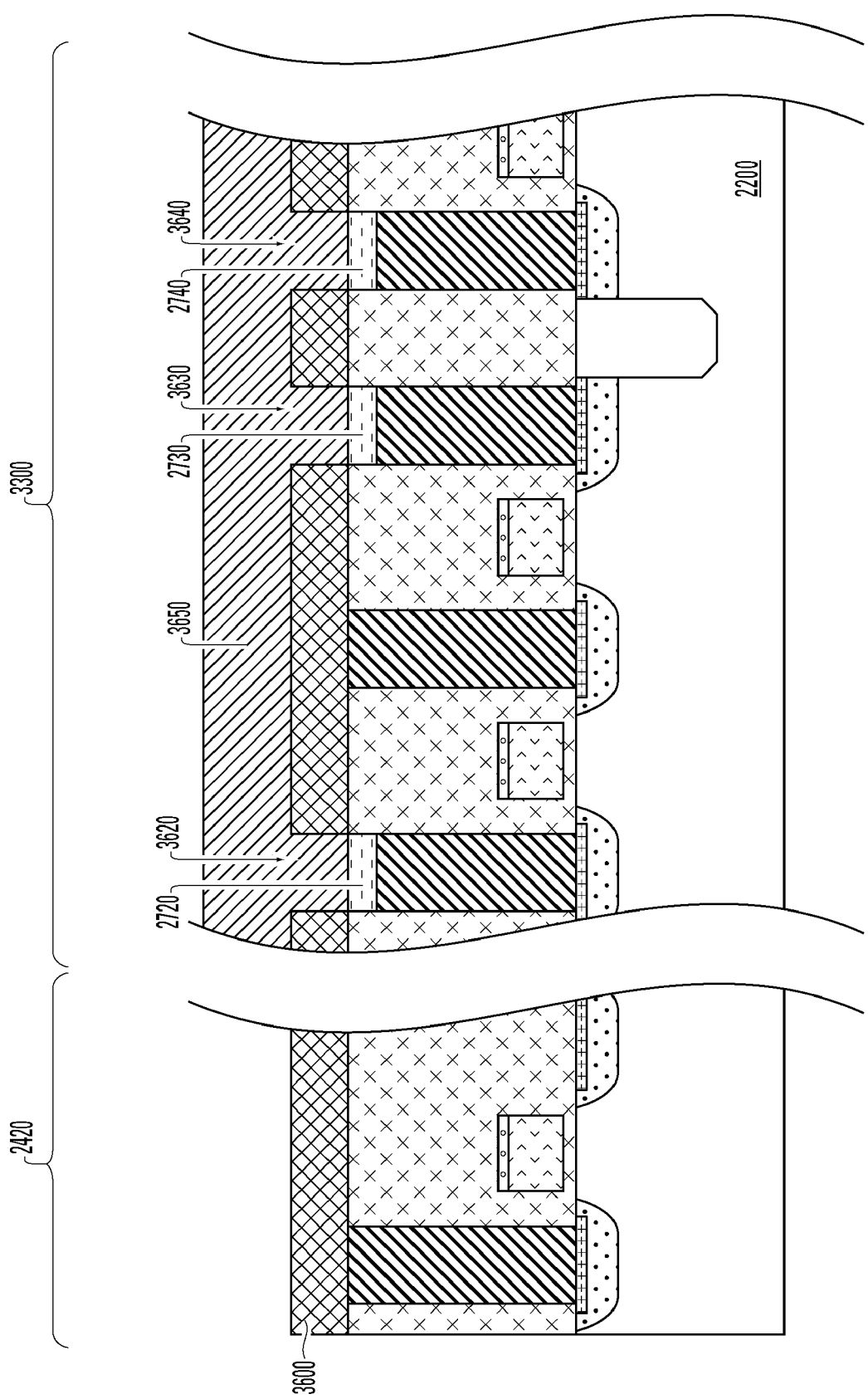
Figure 37:
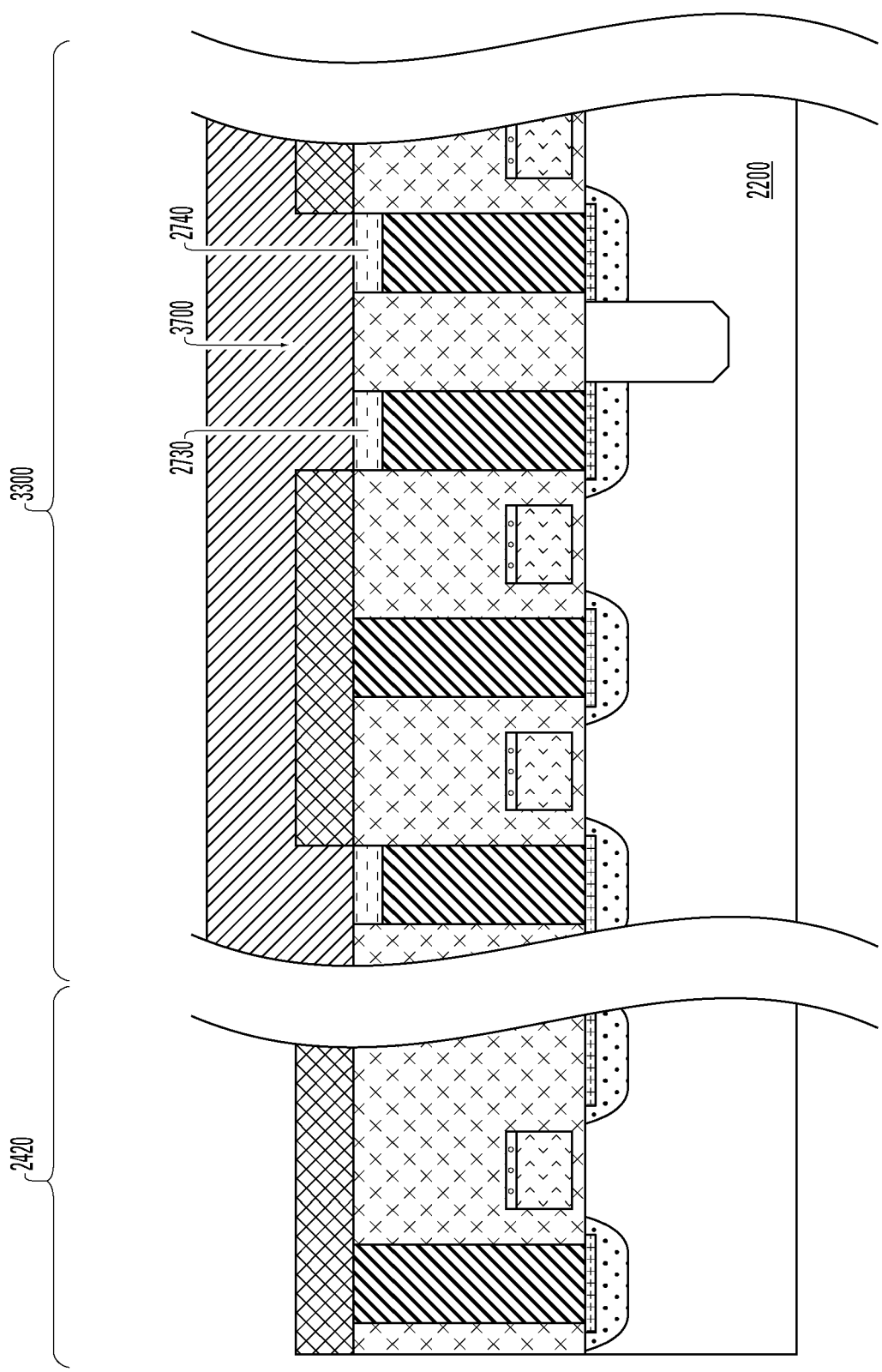
FIG. 37 illustrates an alternative embodiment of FIG. 36.

Next a dielectric layer 3600 is formed on the structure illustrated in FIG. 35, vias 3620, 3630, and 3640 are formed in the dielectric layer 3600 to expose the top surfaces of the memory portions 2720, 2730, 2740, and bit line material is patterned on the memory cell region 3300, resulting in the memory device illustrated in FIG. 36 having a bit line 3650 comprising a barrier material in contact with the memory portions 2720, 2730, and 2740. The bit line 3650 comprises a barrier material on the memory portions to prevent injection of metal-ions from the bit line 3650 into the memory portions 2720, 2730, 2740. In FIG. 36 vias are formed above each memory region. In an alternative embodiment, a single via is formed between adjacent memory regions, such as via 3700 and memory portions 2730 and 2740 as illustrated in FIG. 37.

FIGS. 38-41 illustrate a manufacturing method in accordance with a fourth embodiment.

Figure 38:
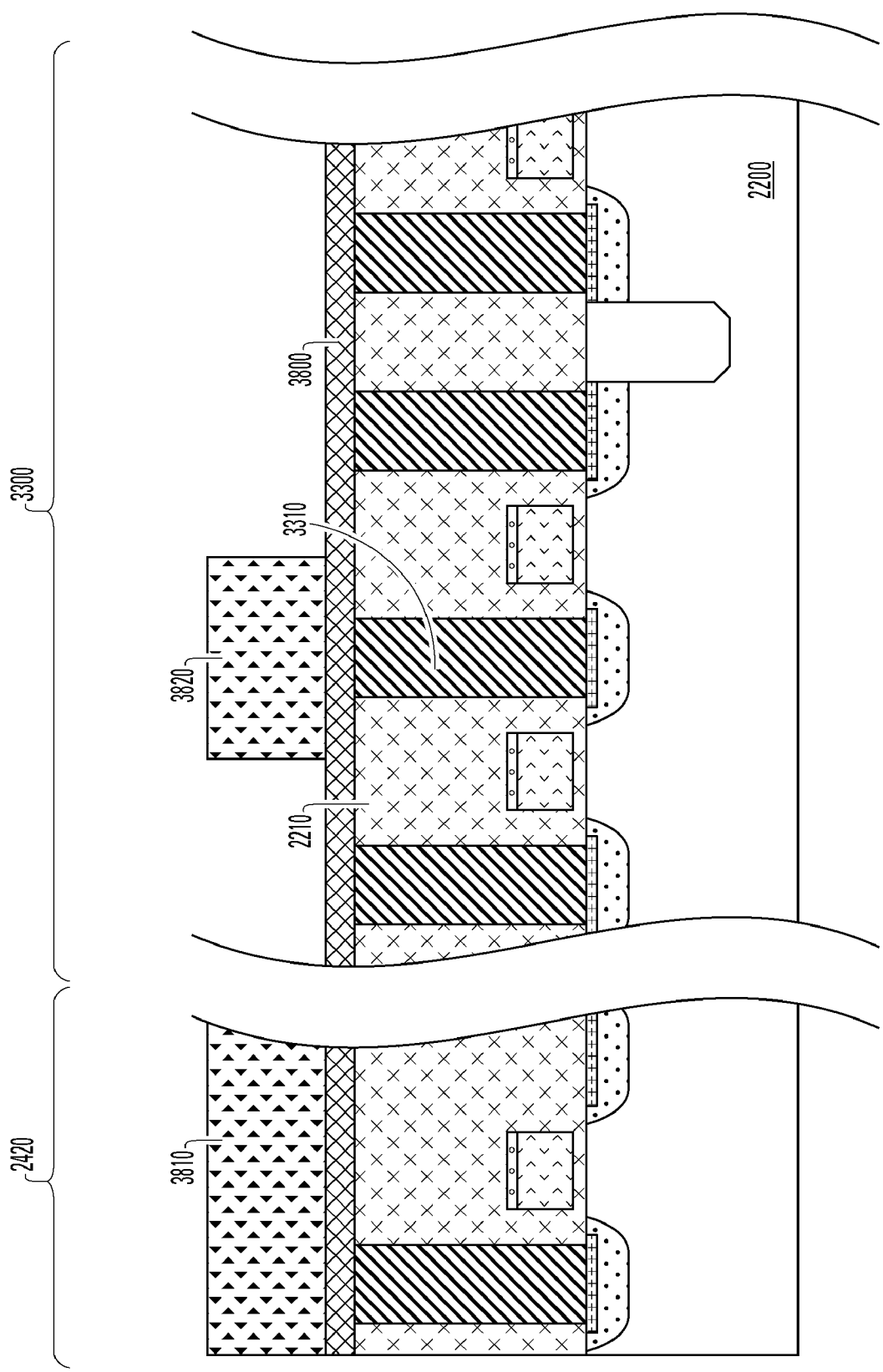
FIGS. 38-41 illustrate a manufacturing method in accordance with a fourth embodiment.

A dielectric layer 3800 is formed on the top surface 2460 of the dielectric 2210 of the structure illustrated in FIG. 33, and a layer of photoresist is patterned to form photoresist 3810 overlying the periphery region 2420 and photoresist 3820 on the portion of the dielectric layer 3800 overlying the line 3310, resulting in the structure illustrated in FIG. 38.

Figure 39:
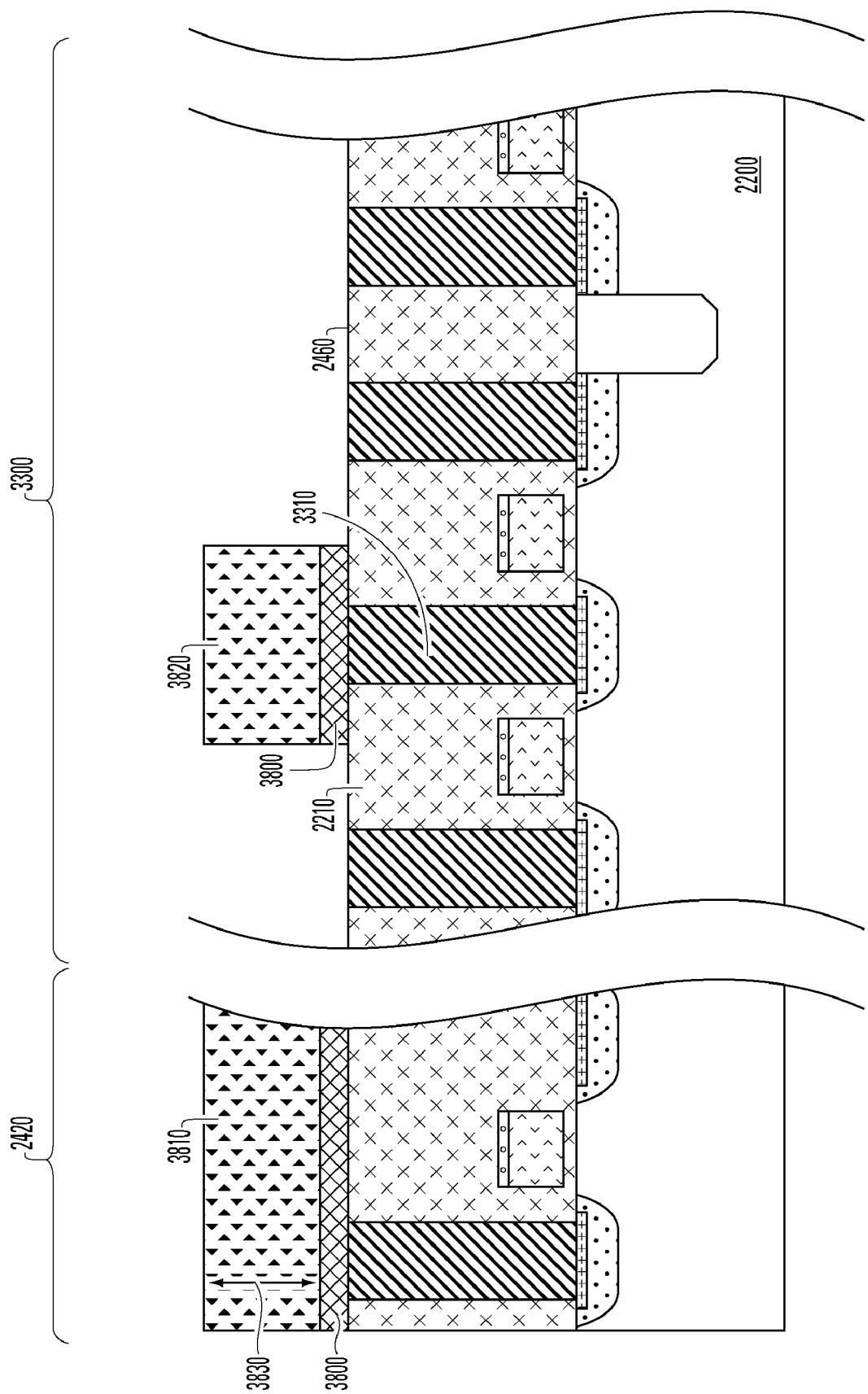

Next, the dielectric layer 3800 is etched using the photoresist 3810, 3820 as a mask, thereby exposing the top surface 2460 of the dielectric 2210 not covered by the photoresist 3820 in the memory cell region 3300, resulting in the structure illustrated in FIG. 39.

Figure 40:
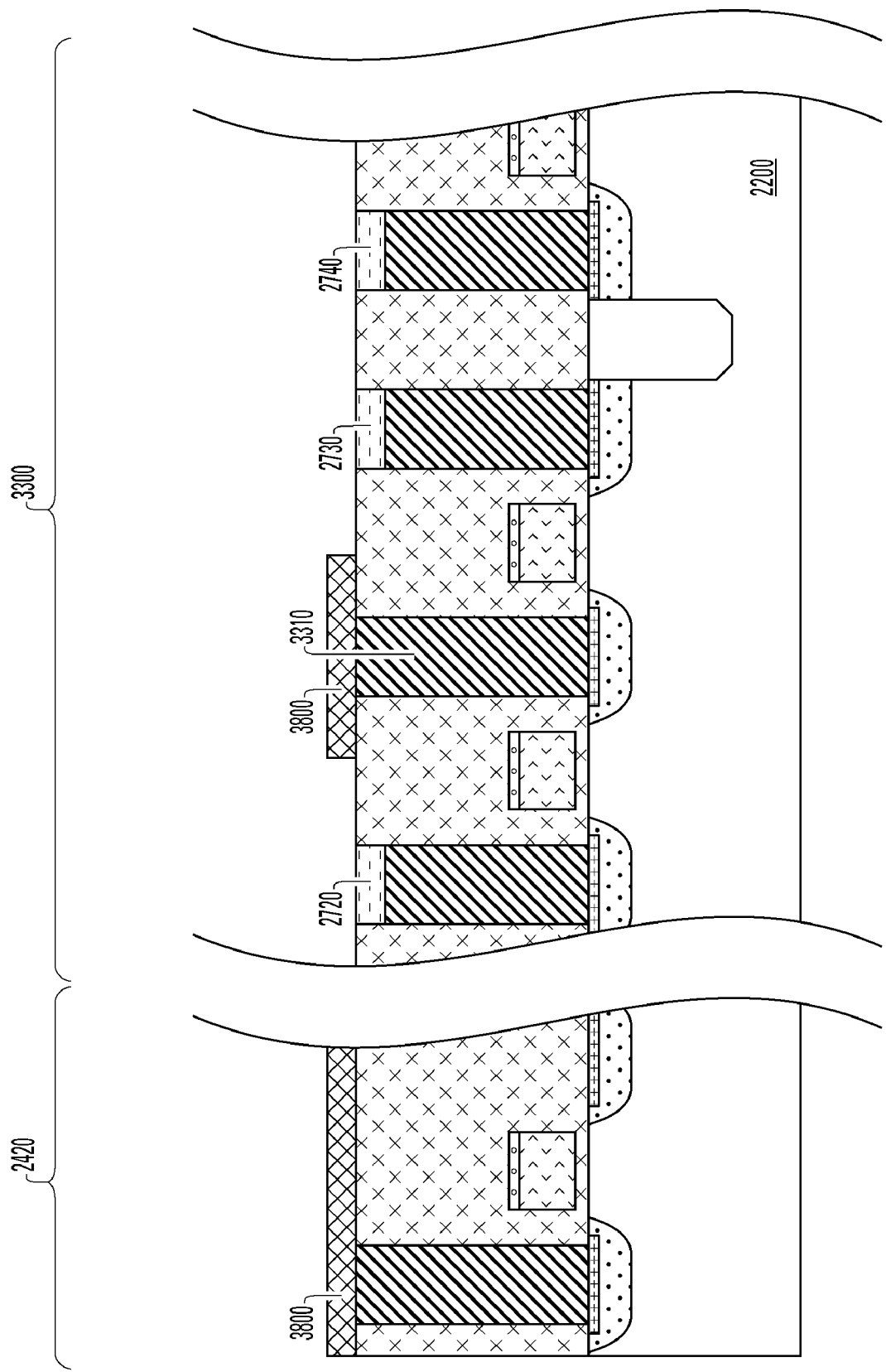

Next, an oxygen plasma strip is performed to form the memory portions 2720, 2730, and 2740 from the tungsten material of the plugs 2520, 2530, and 2540 and a wet strip process removes any remaining photoresist 3810, 3820, resulting in the structure illustrated in FIG. 40.

Next, an optional post furnace oxidation step is performed on the structure illustrated in FIG. 40. Because the plug 2450 and the line 3310 are passivated by the dielectric layer 3800, the plug 2450 and line 3310 will not be affected by a furnace oxidation step.

Figure 41:
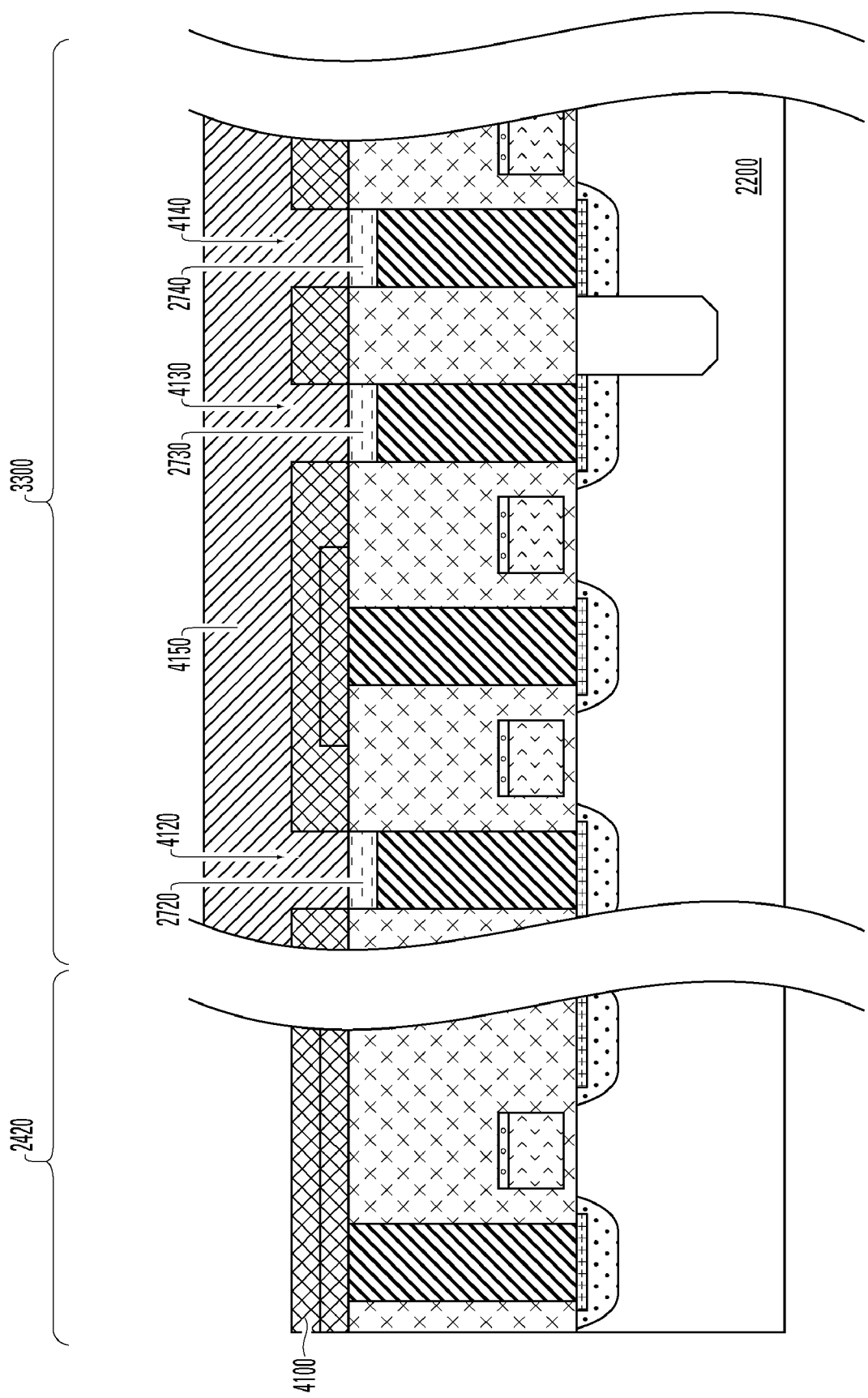
Figure 42:
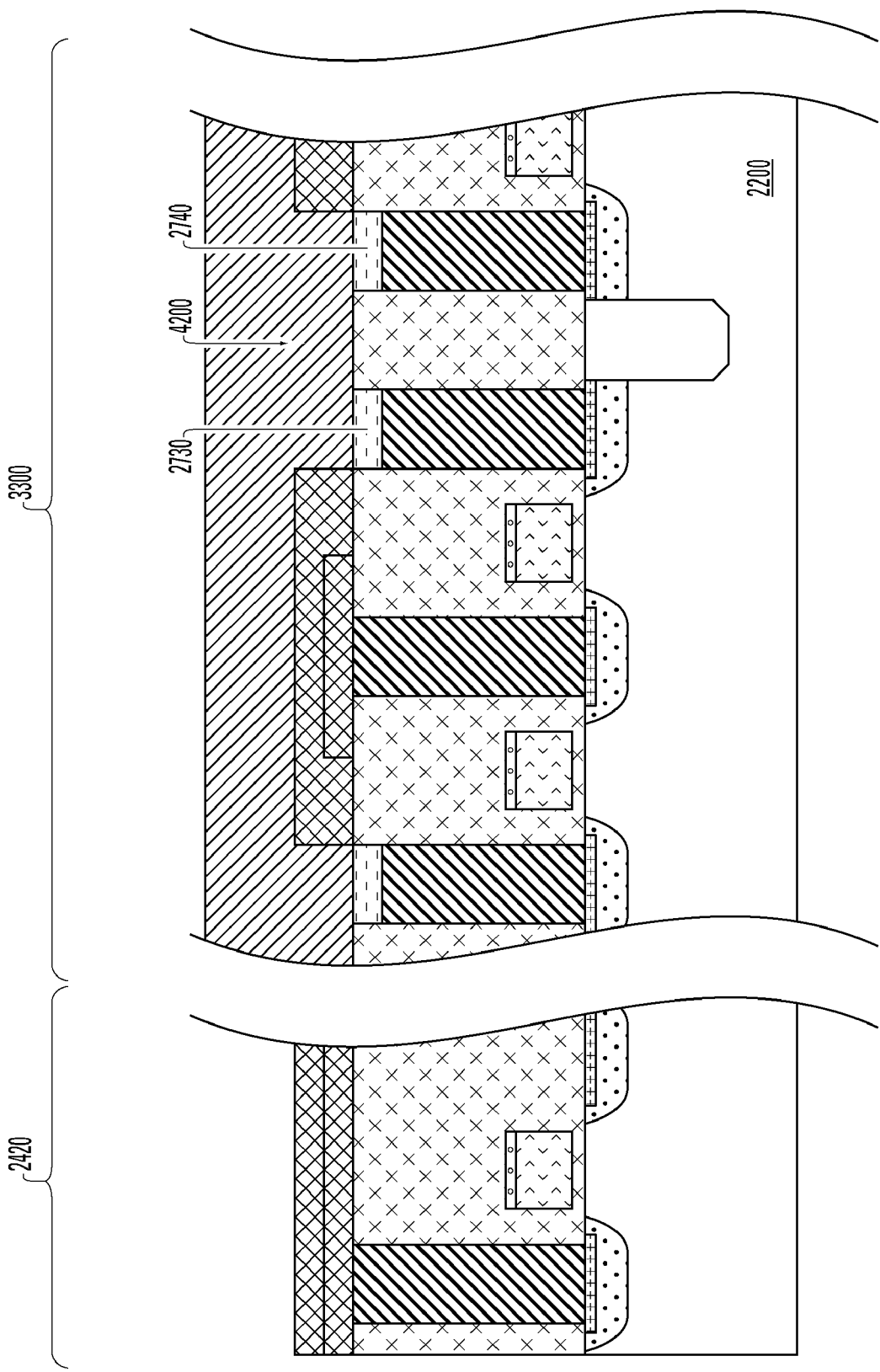
FIG. 42 illustrates an alternative embodiment of FIG. 41.

Next a dielectric layer 4100 is formed on the structure illustrated in FIG. 40, vias 4120, 4130, and 4140 are formed in the dielectric layer 4100 to expose the top surfaces of the memory portions, and bit line material is patterned on the memory cell region 3300, resulting in the memory device illustrated in FIG. 41 having a bit line 4150 in contact with the memory portions. In FIG. 41 vias are formed above each memory region. In an alternative embodiment, a single via is formed between adjacent memory regions, such as via 4200 and memory portions 2730, 2740 as illustrated in FIG. 42.

Figure 43:
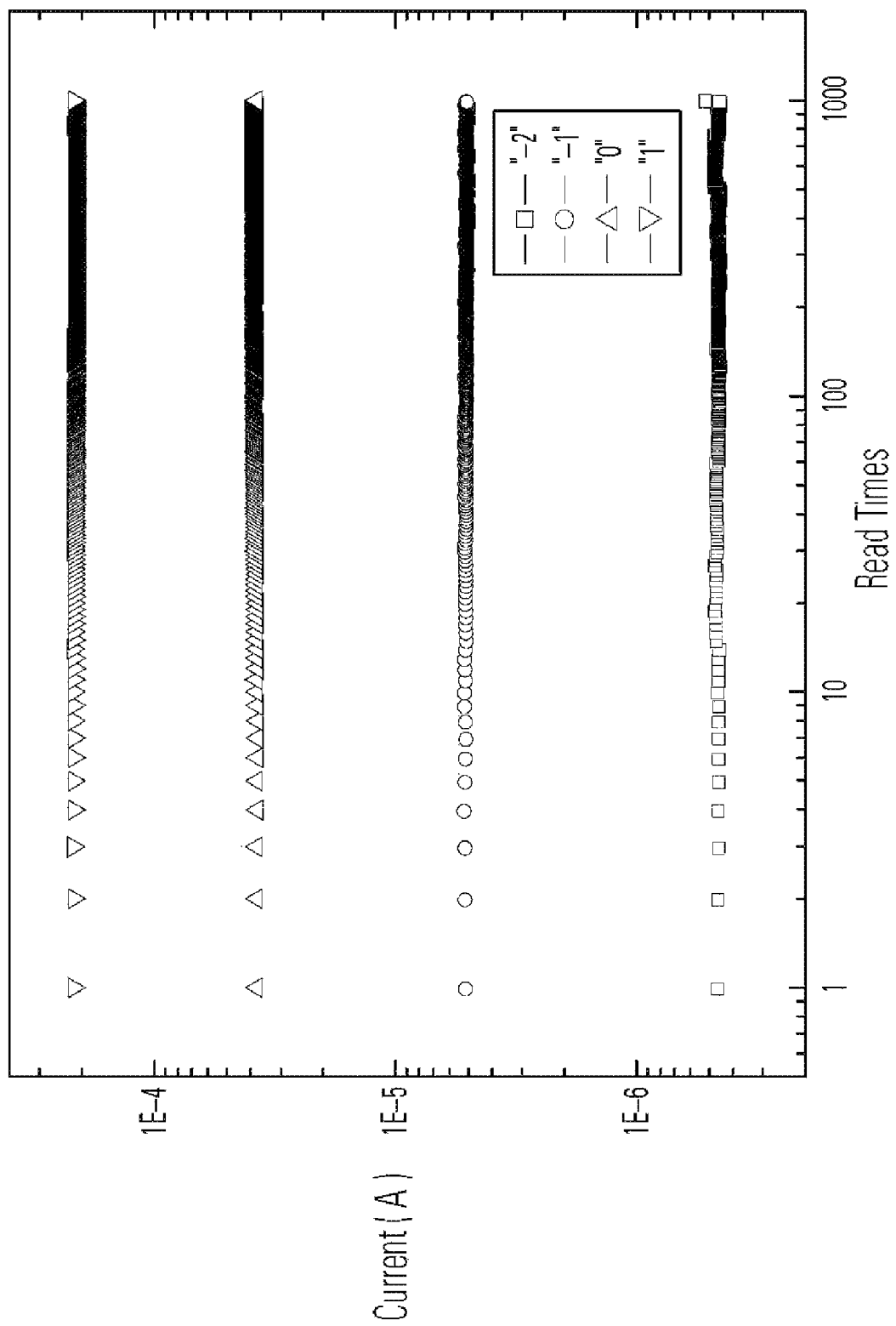
FIG. 43 illustrates read current versus number of read times for the memory cell of FIG. 22 programmable to one of four different resistance states.

FIG. 43 illustrates read current versus number of read times for the memory cell 2133 of FIG. 22 programmable to one of four different resistance states, the memory region 2162 formed only by down-stream plasma oxidation. As can be seen in FIG. 43, four stable resistance states (2 bits/cell) for the memory region 2162 can be programmed and read, the programming in this example being by a pulse operation with different pulse times for each state. As can be appreciated, more than four states can also be achieved. The $WO_x$ of the memory region 2162 provides enough operation window for multi-bit operation, the memory region 2162 having a minimum resistance difference between states of greater than approximately 500 ohms in the embodiment of FIG. 43.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

What is claimed is:

1. A memory device comprising:
   a bottom electrode;
   a memory element on the bottom electrode, the memory element comprising at least one tungsten-oxygen compound and programmable to at least two resistance states; and
   a top electrode comprising a barrier material on the memory element, the barrier material preventing movement of metal-ions from the top electrode into the memory element.

2. The memory device of claim 1, wherein the memory element further comprises a tungsten portion, the at least one tungsten-oxygen compound self-aligned to the tungsten portion of the memory element.

3. The memory device of claim 1, wherein the memory element is programmable to more than two resistance states.

4. The memory device of claim 1, wherein the memory element comprises $WO_3$, $W_2O_5$, and $WO_2$.

5. The memory device of claim 1, wherein the memory element has a top surface, and the at least one tungsten-oxygen compound has a distribution which varies with distance from the top surface.

6. The memory device of claim 5, wherein the memory element contacts the top electrode at the top surface.

7. The memory device of claim 1, further comprising bias circuitry adapted to apply a bias arrangement to the memory element for storing a data value, wherein the bias arrangement for storing the data value comprises a sequence of pulses adapted to set the resistance state of the memory element to a resistance corresponding to the data value.

8. The memory device of claim 1, wherein the bottom electrode comprises a terminal of an access device, the top electrode comprises a portion of a bit line, and the memory element comprises a conductive plug contacting the bottom electrode and extending through a dielectric layer to contact the top electrode.

9. A method for manufacturing a memory cell, the method comprising:
   forming a bottom electrode;
   forming a memory element on the bottom electrode, the memory element comprising at least one tungsten-oxygen compound and programmable to at least two resistance states;
   forming a top electrode comprising a barrier material on the memory element, the barrier material preventing movement of metal-ions from the top electrode into the memory element.

10. The method of claim 9, wherein the forming the memory element step comprises:
    forming a dielectric layer on the bottom electrode;
    forming a via in the dielectric layer to expose the bottom electrode;
    forming tungsten material in the via; and
    oxidizing a portion of the tungsten material in the via to form the memory element.

11. The method of claim 10, wherein the oxidizing a portion of the tungsten material step comprises a plasma oxidation.

12. The method of claim 11, wherein the oxidizing a portion of the tungsten material step further comprises a thermal oxidation.

13. The method of claim 9, wherein the memory element is programmable to more than two resistance states.

14. The method of claim 9, wherein the memory element comprises $WO_3$, $W_2O_5$, and $WO_2$.

15. The method of claim 11, wherein the memory element has a top surface, and the at least one tungsten-oxygen compound has a distribution which varies with distance from the top surface.

16. The device of claim 1, wherein the top electrode comprises a portion of a bit line.

17. The device of claim 1, further comprising:
an access transistor having source and drain regions in a substrate; and
a tungsten plug electrically coupled between the memory element and one of the source and drain regions of the access transistor.

* * * * *